(12) United States Patent
Chan et al.

(10) Patent No.: US 7,900,079 B2
(45) Date of Patent: Mar. 1, 2011

(54) DATA CAPTURE WINDOW SYNCHRONIZING METHOD FOR GENERATING DATA BIT SEQUENCES AND ADJUSTING CAPTURE WINDOW ON PARALLEL DATA PATHS

(75) Inventors: Kenneth Y. Chan, Hopewell Junction, NY (US); Kevin W. Kark, Poughkeepsie, NY (US); George C. Wellwood, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 1237 days.

(21) Appl. No.: 11/463,955

(22) Filed: Aug. 11, 2006

(65) Prior Publication Data
US 2008/0126664 A1    May 29, 2008

(51) Int. Cl.
*G06F 1/12* (2006.01)
(52) U.S. Cl. .................................... 713/400; 713/600
(58) Field of Classification Search ................. 713/400, 713/600
See application file for complete search history.

(56) References Cited

U.S. PATENT DOCUMENTS

| | | | |
|---|---|---|---|
| 5,325,516 A | 6/1994 | Blomgren et al. | |
| 6,073,253 A | 6/2000 | Nordstrom et al. | |
| 6,105,144 A | 8/2000 | Wu | |
| 6,449,727 B1 | 9/2002 | Toda | |
| 6,553,527 B1 * | 4/2003 | Shephard, III | 714/733 |
| 6,625,176 B1 | 9/2003 | Amann et al. | |
| 6,892,314 B2 * | 5/2005 | Chen | 713/401 |
| 6,988,231 B2 * | 1/2006 | Barnett | 714/733 |
| 7,035,368 B2 * | 4/2006 | Pickering et al. | 375/376 |
| 7,069,458 B1 * | 6/2006 | Sardi et al. | 713/401 |
| 7,089,440 B2 * | 8/2006 | Wu | 713/401 |
| 7,321,617 B2 * | 1/2008 | Garlett et al. | 375/224 |
| 7,334,148 B2 * | 2/2008 | Liu et al. | 713/401 |
| 7,590,879 B1 * | 9/2009 | Kim et al. | 713/401 |
| 7,633,877 B2 * | 12/2009 | Sharma et al. | 370/241 |
| 7,680,179 B2 * | 3/2010 | Garlett et al. | 375/226 |
| 2001/0054135 A1 | 12/2001 | Matsuda | |
| 2007/0140397 A1 * | 6/2007 | Jaussi et al. | 375/371 |

\* cited by examiner

*Primary Examiner* — Chun Cao
(74) *Attorney, Agent, or Firm* — Jon A. Gibbons; Fleit Gibbons Gutman Bongini & Bianco PL

(57) ABSTRACT

A self test function in the Memory Controller is utilized to generate unique and continuous data patterns for each of the words which are stored into two consecutive DRAM addresses in two spaced store operations. The self test function then generates fetch commands to read back the unique data patterns from the two DRAM addresses. In the fetch operations, the data transmission for each operation and between both operations is contiguous (no gaps). A self test data comparison function is then used to compare these fetched data words to data patterns which are generated from the self test data generator. Bit error counters from the memory controller keeps track of any miscompares. By reading out a unique signature from these bit counters, it can be determined whether the store path data are misaligned early or late or correct and/or the fetch path data are misaligned early or late or correct. In addition, the exact number of cycles the data are early or late is known. Based on the last results, either or both the store and/or fetch data path capture window parameters are adjusted to correct or early or late bit position.

16 Claims, 5 Drawing Sheets

Figure. 1.0
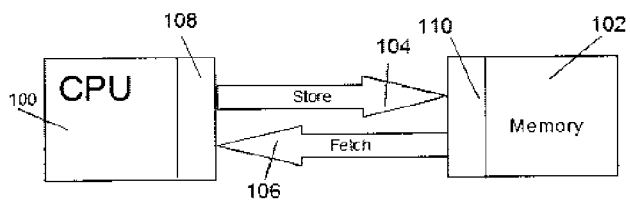
Fig. 1a - CPU and Memory Data Transfer
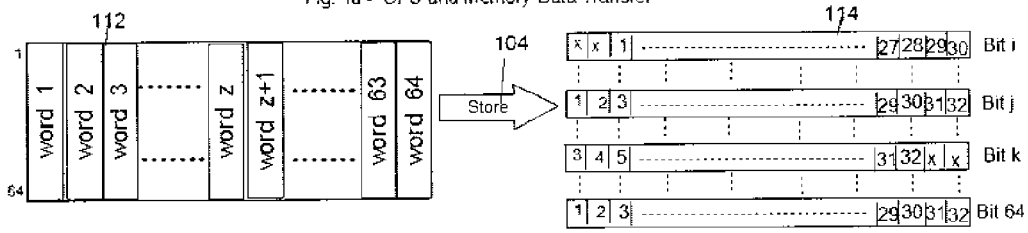
Fig. 1b - Block of Data containing 32 words with 64 bits for Store Command
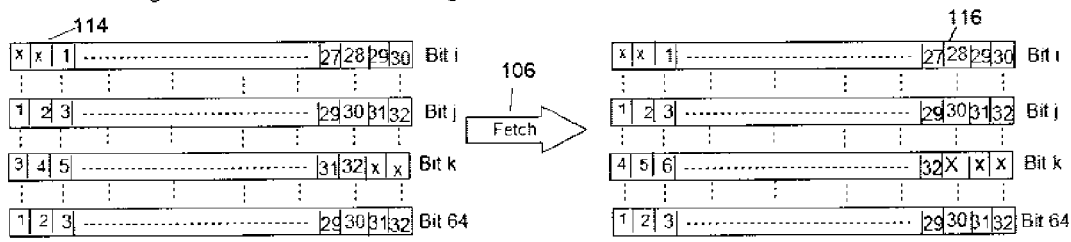
Fig. 1c - Block of Data containing 32 words with 64 bits for Fetch Command

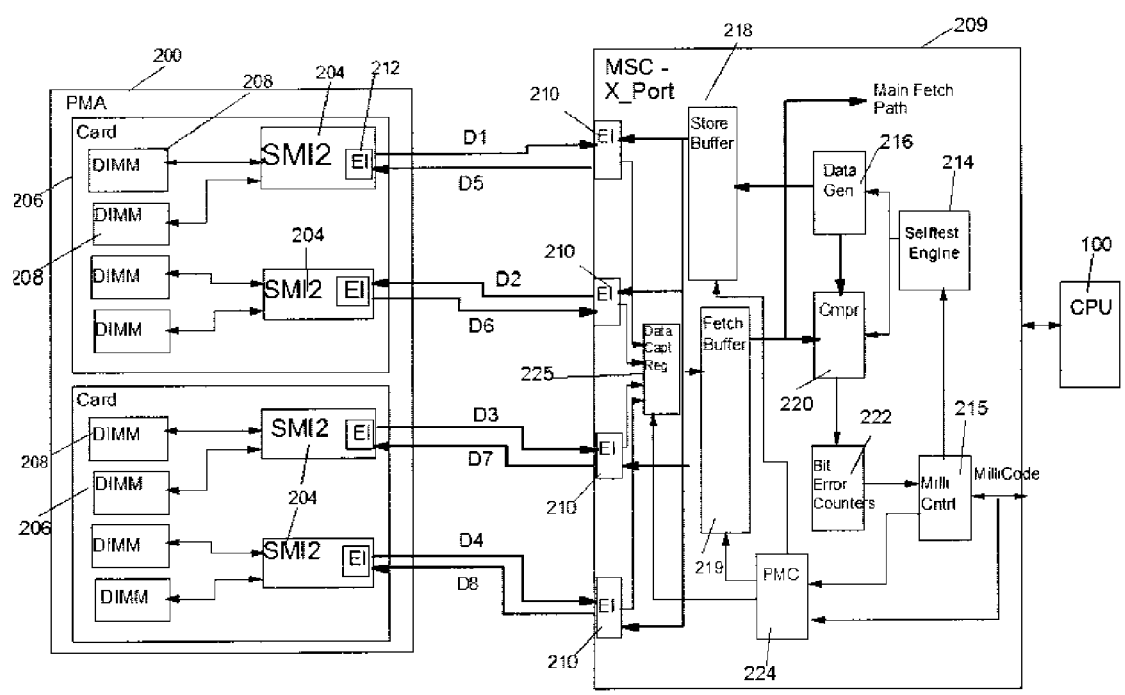
Figure 2.0

Figure. 3.0
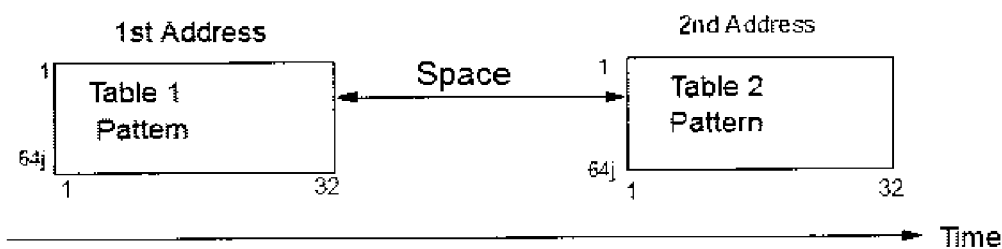
Fig. 3A - Store Coammand with Space
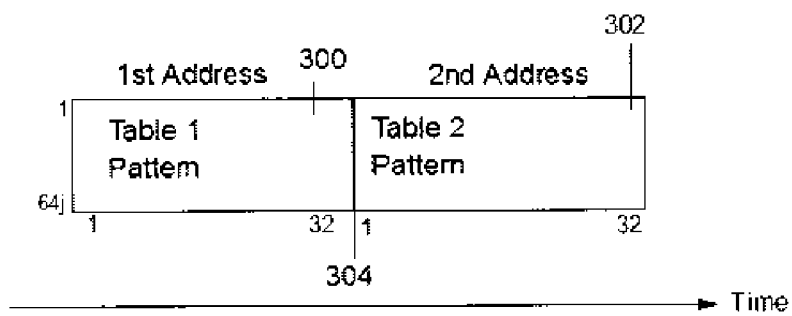
Fig. 3B - Fetch Command without Space

Figure 4.0
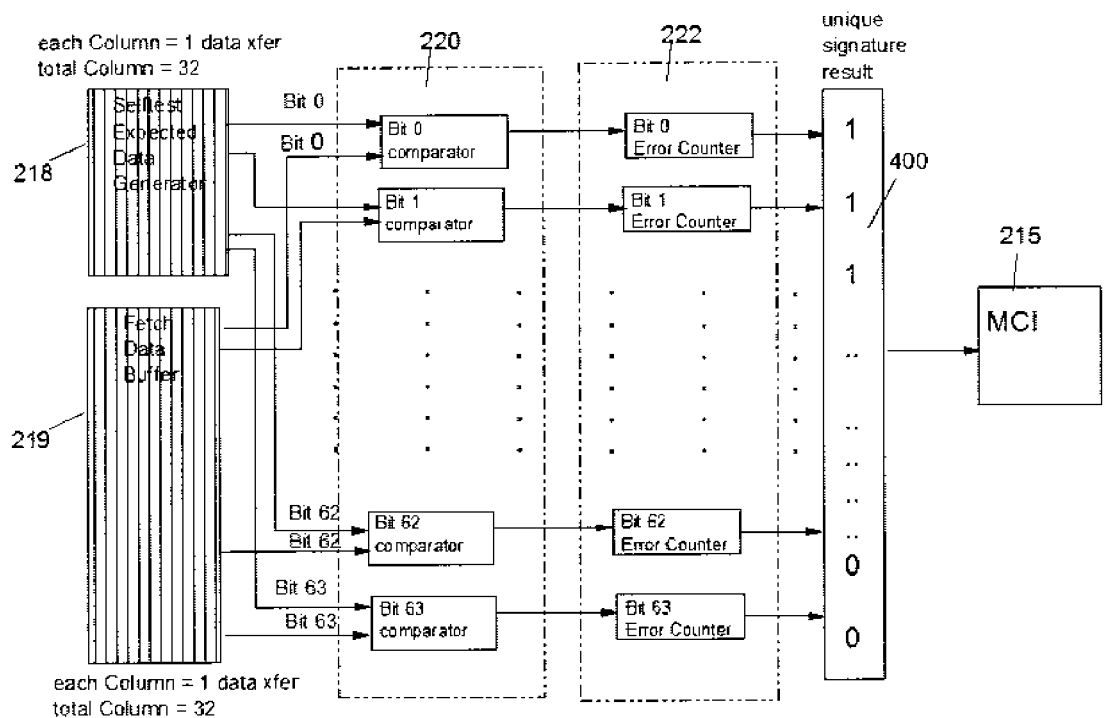

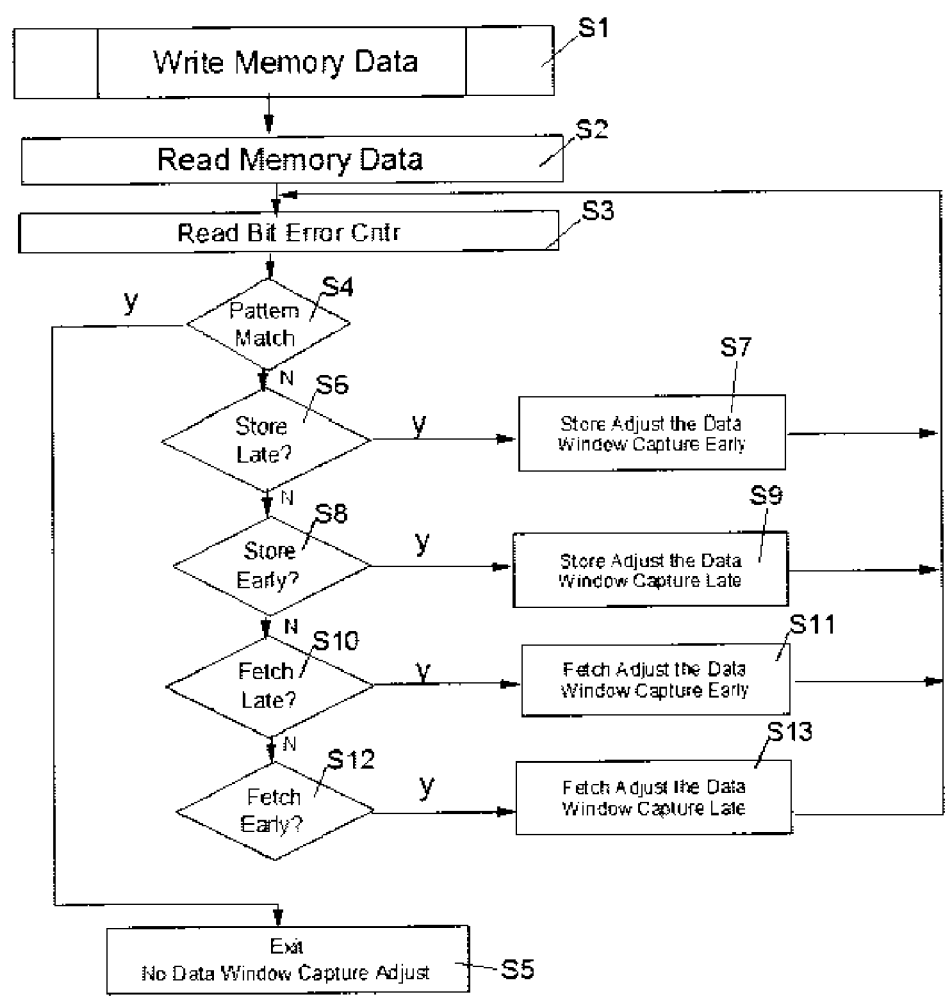
Figure 5.0

DATA CAPTURE WINDOW SYNCHRONIZING METHOD FOR GENERATING DATA BIT SEQUENCES AND ADJUSTING CAPTURE WINDOW ON PARALLEL DATA PATHS

RELATED APPLICATIONS

U.S. application Ser. No. 11/421,167 filed May 31, 2006, the subject matter of which application is incorporated herein by reference.

FIELD OF THE INVENTION

This invention relates to the movement of data bits between portions of computer systems. More particularly, this invention relates to alignment of data capture windows to synchronize the movement of data bits through parallel data paths.

BACKGROUND OF THE INVENTION

The parallel transfer of the bits of data words between a processor and memory is along separate store and fetch paths. The store path proceeds from the controller of the memory to the central storage store buffers, to a set of dynamic random access memory chips (DRAMs) of the memory. The fetch path proceeds from the set of DRAMs to the central storage fetch buffers of the memory controller. The bit positions of the stored and fetched words are physically divided among different components that may have different latency characteristics (the time it takes to propagate data through the path). For example, a memory subsystem of a computer system can include multiple independent processor memory arrays (PMAs) that supply blocks of data in a plurality of parallel transfers of 64 bit wide data words. The bits of the data words come from different synchronous memory interface (SMI2) chips located on separate memory cards. The SMI2 chips communicate with the DRAMs of the memory subsystem and also with the main storage controller (MSC) chip. When the MSC chip receives a data word on the fetch data bus, it must capture all the 64 bits of a data word from the SMI2 chips within a capture window. Likewise, when the SMI2 chips receive data on the store data bus, they must also capture all 64 bits of a data word within a capture window. Both the SMI2 chips and the MSC chip have interface logic to capture data bits. However, there can be differences in the time it takes the bits in different bit positions of the data word to travel the paths between the SMI2 chips and the MSC chip because they travel through different paths with different latency characteristics. As a result, bits in the data words of the block can be misaligned with bits in one or more positions of one word arriving at their destination with bits in bit positions of other data words. The capture logic or windows are adjustable to accommodate different operating parameters in the chips. One method that is used to adjust these windows is a manual setting of the capture latches by trial and error. This method is time consuming and can require different adjustments of latches in different computers with the same model number.

SUMMARY OF THE INVENTION

In accordance with the present invention, the adjustment of the data capture window is accomplished dynamically for both the store and fetch paths from the Memory Controller based on use of a storage pattern providing a unique signature identifying different misalignment patterns.

Therefore, it is an object of the present invention to provide an improved method of adjustment of the capture window.

A further object of this invention is to provide an automatic method of adjustment of the capture windows that makes use of the self test capability of the memory.

Therefore it is another object of the invention to eliminate the manual adjustment of capture windows using trial and error methods.

DESCRIPTION OF THE DRAWINGS

The invention can best be understood by the following description while referring to the accompanying drawings of which:

FIGS. 1A to 1C are schematic diagrams illustrating the transfer of misaligned data bits between a CPU and storage elements of a computer;

FIG. 2 is a schematic of a memory subsystem having a memory controller with a self test capability;

FIG. 3 is a schematic diagram of the use of loading of data patterns into a memory in accordance with the present invention;

FIG. 4 is a schematic diagram of operation of self test functions in accordance with the present invention; and FIG. 5 is a flow chart of the detection and correction process in accordance with FIGS. 2 to 4.

DETAILED DESCRIPTION OF THE INVENTION

FIGS. 1A to 1C show transfers between a central processing unit (CPU) 100 and storage 102, performed using separate store 104 and fetch 106 paths. In a typical transfer, a block of data 112 containing 32 words of 64 bits each is transmitted from the CPU to storage and captured in the storage capture latches 110. The bits of each of each word are arranged in bytes and are transmitted in parallel. When the capture latches are properly timed to the length of latency of the parallel paths between the CPU and storage, all bits in each of the words are properly captured as indicated by bit positions i and 64 in FIG. 1B. However, the paths of the parallel bit store lines may have different lengths and have different latency characteristics resulting in data bits of a word arriving in the capture latches 110 at different times. If the capture latches have not been properly adjusted for the data line delays of a particular path, the data in different bit positions of the word will not be correct. As shown in bit position 1, the data arrives late so that the first two bits captured are extraneous and are not bit 1 or 2 of word 1. While in bit position k, data arrives early and the data latch misses bits in that position for words 1 and 2 and instead places the k bit from word 3 in word 1. As can be seen, this results in the misalignment of the bit positions 1 and k in all of the words of the block of data.

When this misaligned block of data is read back a different set of data lines 106 are used for the fetch. These will not necessarily have the same latency for the store lines of the same bit position. As shown in FIG. 1C, bit position 1 may be early so that the misalignment in bit position 1 may be one bit instead of two bits while bit position k, may contain another delay. In FIG. 1C, the capture latched for bit positions i and 64 are assumed to be properly adjusted so that the correct bits in bit position 2 are in each of the 64 words of the diagram.

The memory subsystem 100 contains a plurality of independent processor memory arrays (PMAs) that supply blocks of data. FIG. 2 shows one of these PMAs 200. A block of data in PMA 200 comprises 32 data words of 64 bits each. The data words are stored in 4 synchronous memory interface (SMI2) chips 204 each of which each handle 16 bits of the 64 bit data word. The SMI2 chips are located on 2 memory cards 206. The SMI2 chips communicate with the DRAMs 208 located in and also with the main storage controller (MSC) chip 209. Both the 4 SMI2 chips and the MSC chip have adjusted store data capture windows and elastic interface (EI) logic 210 and 212 to align each data bit to accommodate the latency differences in the paths the bits of a word must travel. Among other things, these latency differences can be due to differences in the silicon delays among the 4 SMI2 chips and to connectivity differences in the connecting paths D1 to D8 traveled by the bit positions of a word.

As pointed out above, when the MSC 209 chip receives data on the fetch data bus, it must capture all the data bits of each word from the 4 SMI2 chips within the same capture window of the data capture register 225. Likewise, when the SMI2 chips receive data on the store data bus, they must capture all the data bits of a word within the same capture window of the 4 SMI2 chips. These capture windows are adjustable in the MSC 209 in time by changing different operating parameters to accommodate for the above mentioned latency differences.

This adjustment of the capture windows makes use of a self test function of the memory subsystem performed in the MSC chip 209. The concurrent self test engine 214 is the core of the self test hardware in the MSC 209. Details of the concurrent self test engine can be found in the above mentioned U.S. patent application Ser. No. 11/421,167 (POU920060043) filed on May 31, 2006 which application is hereby incorporated by reference.

The self test engine functions to generate fetch and store patterns for the DRAMs in the dual inline memory modules (DIMMs) 208 in response to millicode commands relayed through dynamic capture millicode capture interface (MCI) controls 215 from the system processor. During test operations, the self test engine is used to generate rotating data patterns, using the data generator 216. These patterns are loaded into the DRAMs 208 through the store buffer, and data stored in the DRAMs are retrieved from the fetch buffer. Data in the fetch buffer are compared with the output of the data generator. The differences between the data generator 216 and fetch buffer 219 outputs are detected by comparator 220 and recorded by the bit error counters 222. The processor memory controller (PMC) 224 controls the store and fetch test operations receiving instructions from the CPU 100 through the MCI controls 215 and the output of the bit error counters 222 are provided to the MCI controls 215. The PMC also controls the adjustment of the timing of the fetched and stored data bits by controlling the latches in register 225.

During the adjustment of the latch timing in register 225, the self test function is used to generate two unique and continuous sets of data patterns shown in tables 1 and 2, one pattern for each of the words in two blocks of 32 data words. As shown in FIG. 3A, the blocks of data patterns of tables 1 and 2 are placed into two consecutive DRAM addresses that are 256 bytes apart. The loading operation of the DRAM addresses are spaced so that as a result of the delay bits to be loaded into the first address do not end up in the second because of the delays. Then, as shown in FIG. 2B, the self test function generates a fetch command to read back the stored data patterns one after the other without a delay between the fetch operations of the two blocks. The fetched data will contain evidence of both store and fetch errors at the leading edge 300 of the table 1 pattern and the trailing edge 302 of the table 2 pattern. It will exhibit store evidence only at the juncture 304 of the two patterns.

When the self test function generates a fetch operation to obtain the data in the same central storage locations as the store, the "expected" stored word data patterns are regenerated for each transfer to the MSC chip. This data pattern from the fetch data buffer 219 is compared with regenerated data pattern from the data generator 216. Each data bit comparison is fed to a corresponding single bit error comparator 220. Each bit position of a pair of transfers sent to the error counter 222 which keeps track of any miscompares.

As shown in FIG. 4, the bit error counter 222 records if either the fetched bit 0 in word 0 does or does not match the expected regenerated pattern bit 0 or the bit 0 in word 1 does not match or they both do not match. As a result, the error counter 222 retains a unique combination of digits for each possible error condition.

This self test function to store another set of patterns is used to detect the alignment or misalignment of the store path window and fetch path window as observed at the fetch detection logic by unique signatures 400 of the self test detection logic. As pointed out above in verifying of the store path window, alignment is to store two unique data patterns into two consecutive DRAM addresses. The first store operation is done with a unique data pattern for first pair of transfer as before. The second store is done to the next consecutive address of the DRAMs after many cycles after the first store completes so there is no chance that the second store would overlay any part of the data window of the first store. The data block for both stores would contain unique data in all 64 data words. The next operations are 2 back-to-back fetches to the same central storage locations as the stores. The store data patterns are regenerated for each transfer in the MSC chip and compared to the returning data from the SMI2 chips for the 2 data blocks. Again, there are bit error counters for each bit position of a pair of transfers that keeps track of any miscompares. The counter 0 records 1 miscompare if either bit 0 in word 0 does not match the regenerated pattern or bit 0 in word 1 does not match or they both do not match.

With the store and fetch operation described in connection with FIG. 3, the 64 counters 222 will provide a unique signature for any early or late store or fetch window error condition. Self test firmware is used to monitor the counters for those conditions and to adjust the fetch and/or store window parameters based on the signature of the counters and rerun the test if it found the signatures of the counters are not all zeroes.

The following examples demonstrate how these unique data result generate by applying unique data patterns for the store path alignment and the fetch path alignment. In addition, these unique signatures also show the number of cycles which are early or late.

1. Store Data Capture Window is Early
2. Store Data Capture Window is Late
3. Fetch Data Capture Window is Early
4. Fetch Data Capture Window is Late
5. Store/Fetch Data Capture Window are Correct
6. Store/Fetch Data Capture Windows are both Late.

Tables 1 and 2—Loaded Data Patterns

As pointed out previously, Tables 1 and 2 of the appendix show data patterns that are preloaded into the self test data generator for the store and fetch path error detection alignment. Only one bit of each alternate word of the entire two word data pattern has to be different than the rest of the data bits of the word. Each data pattern are rotated one bit position has to be different than the previous of the data transfer pattern. As table 1 shows, the "7FFF_FFFF_FFFF_FFFF" and "BFFF_FFFF_FFFF_FFFF" are the unique data pattern for the first two data transfers. The rest of the 32 pairs of data transfers are each 1 bit different from the previous data pattern and the next data pattern. These two 32 data transfers has to be stored into two consecutive DRAM addresses within a number of gaps to ensure no overlap on the store data. Following are examples of fetched outputs for each of the store and fetch error situation, above numbered.

Tables 3a and 3b. Store Data Capture Window is Early

This example shows the results when the data capture window is three cycles early by reading out the unique signature from these bit error counters. In the example, the expected data pattern is "7FFF FFFF FFFF FFFF" but the returning data pattern is "FFFF FFFF FFFF FFFF" on the first fetched word transfer. Therefore, one bit is miscompared for this transfer. The error counters for bit 0 is increment by '1'. After all transfers are completed the return, an unique signature is going to indicate the data capture window is early. FIG. 6 shows how this unique signature of the store capture window is mis_aligned by three cycles. The unique signature is showed as the following:

"2222_2222_2222_2222_2222_2222_2222_2111_
2222_2222_2222_2222_2222_2222_2222_2222_
2111"

Since the "111" occurs in the middle and end of the 2 word pattern, it indicates that store data capture is 3 cycles early. Therefore, the data capture window needs to be retarded by three cycles.

Tables 4a and 4b. Store Data Capture Window is Late

Tables 4a and 4b show the results when data capture window is late as a result of store path misalignment. The example shows the data capture window three cycles late by reading out the unique signature from these bit error counters. The expected data pattern is "7FFF FFFF FFFF FFFF" but the returning data pattern is "EFFF FFFF FFFF FFFF" on the first fetched word transfer. Therefore, two bits are miscompared for this transfer. The error counters for bit 0 and bit 3 are incremented by '1'. After the data transfers are completed the resultant unique signature is going to indicate the data capture window is late based on the result of these bit error counters. The unique signature is showed as the following:

"1112_2222_2222_2222_2222_2222_2222_2222_
1112_2222_2222_2222_2222_2222_2222_2222"

Since "111" occurs in the beginning and middle of the 2 word transfer it indicates data reception is late by 3 cycles for proper store path alignment. Therefore, the data capture window needs to be moved up by three cycles.

Once the store capture windows are adjusted, the fetch capture windows can be adjusted using data of one of Tables 1 or 2.

Tables 5a and 5b. Fetch Data Capture Window is Early

Tables 5a and 5b show the fetched data pattern when the fetch data capture window is early. The expected data pattern is "7FFF FFFF FFFF FFFF" and the returning data pattern is "FFFF FFFF FFFF FFFF". Therefore, the bit error counter for bit 0 is incremented by '1' since the bit 0 is the only one bit is mis_compared. After all transfers are completed the return, the unique signature is generated and shows the data capture window is early by three cycles. These unique signature are based on the result of these bit error counters. The unique signature is the following:

"2222_2222_2222_2222_2222_2222_2222_2222_
2222_2222_2222_2222_2222_2222_2222_2111_".

Since the "111" occurs only at the end of the data pattern, it indicates fetch data capture is 3 cycles early for proper fetch patch alignment. Therefore, the data capture window needs to set back by three cycles.

Table 6a and 6b. Fetch Data Capture Window is Late

Table 6 shows the data pattern from the DRAM. The expected data pattern is "7FFF FFFF FFFF FFFF" and the returning data pattern is "EFFF FFFF FFFF FFFF". Therefore, the bit error counter for bit 0 and bit 3 are incremented by '1' since these two bits are miscompared. After all data transfer are completed the return, the unique signature is generated and show the data Capture window is late by three cycles. The unique signature is showed as the following:

"1112_2222_2222_2222_2222_2222_2222_2222_
2222_2222_2222_2222_2222_2222_2222_2222_".

When the "111" only occurs at the beginning of the dual word returns, it indicates data capture is 3 cycles too late for fetch patch alignment. Therefore, the data capture window needs to be moved up by three cycles.

Table 7. Store/Fetch Data Capture Window is Correct

Table 7 shows the data pattern return with the data capture words properly adjusted. The expected data pattern is "7FFFF FFFF FFFF FFFF" and the returning data pattern is also "7FFF FFFF FFFF FFFF". The unique signature is therefore all zeroes.

Table 8a and 8b—Data Capture Window Late for Store and Fetch Commands

Table 8 shows the unique data pattern return for a combination of errors. Each combination of errors provides a unique signature that identifies the misalignment of the combination.

From the above you can see that the unique signature result 400 identifies each possible captured error and combinations thereof. The MCI provides the signature to the CPU 100 which identifies the correction to be made and instructs the PMCs 224 to adjust the appropriate fetch capture windows of the fetch capture register for fetch misalignments and/or the SMI2 controllers to adjust their appropriate store data capture windows for store misalignments.

FIG. 5 is a flowchart of operation of millicodes for error detection and adjustment of capture windows of the interface.

Referring to FIG. 5:

Step 1. Load the initial unique Data Pattern of Tables 1 and 2 into the self test engine 214 and have self test engine run the store operation to load the data patterns into two consecutive memory block addresses.

Step 2. Have the self test engine perform a fetch operation after the store operation is complete.

Step 3. Read the bit error counter after the fetch operation is complete.

Step 4. Determine if the setting of all the capture windows is correct or not.

Step 5. If the bit error counters are all zeroes then the capture windows are correctly adjusted and proceeds to exit the operation.

Step 6. If the signature is not all zeroes, check the bit error counters to determine whether any store capture windows are late.

Step 7. If any store capture windows are late, adjust those windows to capture early. This may require several iterations to get the late storing windows properly adjusted. After each adjustment of step 7, proceed to steps 2 and perform steps 2, 3 and 4 over again until step 6 reads no store late capture windows.

Step 8. Check to see if any of the store capture windows capture early.

Step 9. Adjust any store capture windows that capture early to capture later repeating all iterations necessary to properly adjust the store capture windows.

Step 10. Once the store capture windows are indicated adjusted by step 9, determine if any fetch windows capture late.

Step 11. If any fetch capture windows are indicated as late by the bit error counter data, adjust them early repeating as many iterations as is necessary until step 10 indicates that all fetch late windows are properly adjusted. (In adjusting fetch windows the use of only one of the storage patterns of tables 1 and 2 is necessary.)

Step 12. With the adjustment of the late fetch windows indicated as complete, check to see if the storage patterns indicate if any fetch capture windows capture early.

Step 13. Adjust any capture windows indicated as adjusting early repeating the process as many times as necessary until step 4 indicates that all windows are properly adjusted.

Above we have described one embodiment of our invention. It should be understood that the invention is not limited to this embodiment. Many alterations of the concepts presented here are possible. For instance, the described embodiment relates to transfer of data between a memory and a CPU. The concepts apply equally as well to other transfers. Therefore, it should be understood that the invention should apply to all embodiments thereof falling within the spirit and scope of the following claims.

TABLE 1.0

Unique Data Patterns for 32 Data transfer to the 1st Dram address for Store Command

| Store Data Pattern to 1$^{st}$ Dram address | Description of Memory Controller__Data Transfer Cycle |
|---|---|
| 7FFF__FFFF__FFFF__FFFF | 1st transfer of the store data into the first dram address |
| BFFF__FFFF__FFFF__FFFF | 2nd transfer of the store data into the first dram address |
| DFFF__FFFF__FFFF__FFFF | 3rd transfer of the store data into the first dram address |
| EFFF__FFFF__FFFF__FFFF | 4th transfer of the store data into the first dram address |
| F7FF__FFFF__FFFF__FFFF | 5th transfer of the store data into the first dram address |
| FBFF__FFFF__FFFF__FFFF | 6th transfer of the store data into the first dram address |
| FDFF__FFFF__FFFF__FFFF | 7th transfer of the store data into the first dram address |
| FEFF__FFFF__FFFF__FFFF | 8th transfer of the store data into the first dram address |
| FF7F__FFFF__FFFF__FFFF | 9th transfer of the store data into the first dram address |
| FFBF__FFFF__FFFF__FFFF | 10th transfer of the store data into the first dram address |
| FFDF__FFFF__FFFF__FFFF | 11th transfer of the store data into the first dram address |
| FFEF__FFFF__FFFF__FFFF | 12th transfer of the store data into the first dram address |
| FFF7__FFFF__FFFF__FFFF | 13th transfer of the store data into the first dram address |
| FFFB__FFFF__FFFF__FFFF | 14th transfer of the store data into the first dram address |
| FFFD__FFFF__FFFF__FFFF | 15th transfer of the store data into the first dram address |
| FFFE__FFFF__FFFF__FFFF | 16th transfer of the store data into the first dram address |
| FFFF__7FFF__FFFF__FFFF | 17th transfer of the store data into the first dram address |
| FFFF__BFFF__FFFF__FFFF | 18th transfer of the store data into the first dram address |
| FFFF__DFFF__FFFF__FFFF | 19th transfer of the store data into the first dram address |
| FFFF__EFFF__FFFF__FFFF | 20th transfer of the store data into the first dram address |
| FFFF__F7FF__FFFF__FFFF | 21th transfer of the store data into the first dram address |
| FFFF__FBFF__FFFF__FFFF | 22th transfer of the store data into the first dram address |
| FFFF__FDFF__FFFF__FFFF | 23th transfer of the store data into the first dram address |
| FFFF__FEFF__FFFF__FFFF | 24th transfer of the store data into the first dram address |
| FFFF__FF7F__FFFF__FFFF | 25th transfer of the store data into the first dram address |
| FFFF__FFBF__FFFF__FFFF | 26th transfer of the store data into the first dram address |
| FFFF__FFDF__FFFF__FFFF | 27th transfer of the store data into the first dram address |
| FFFF__FFEF__FFFF__FFFF | 28th transfer of the store data into the first dram address |
| FFFF__FFF7__FFFF__FFFF | 29th transfer of the store data into the first dram address |
| FFFF__FFFB__FFFF__FFFF | 30th transfer of the store data into the first dram address |
| FFFF__FFFD__FFFF__FFFF | 31th transfer of the store data into the first dram address |
| FFFF__FFFE__FFFF__FFFF | 32th transfer of the store data into the first dram address |

TABLE 2.0

Unique Data Patterns for 32 Data transfer to the 2nd Dram Address for Store Command

| Store Data Pattern to the next consecutive Dram address | Description of Memory Controller Data Transfer Cycle |
|---|---|
| FFFF__FFFF__7FFF__FFFF | 1st transfer of the store data into the second dram address |
| FFFF__FFFF__BEFF__FFFF | 2nd transfer of the store data into the second dram address |
| FFFF__FFFF__DFFF__FFFF | 3rd transfer of the store data into the second dram address |
| FFFF__FFFF__EFFE__FFFF | 4th transfer of the store data into the second dram address |
| FFFF__FFFF__F7FF__FFFF | 5th transfer of the store data into the second dram address |
| FFFF__FFFF__FBFF__FFFF | 6th transfer of the store data into the second dram address |
| FFFF__FFFF__FDFF__FFFF | 7th transfer of the store data into the second dram address |
| FFFF__FFFF__FEFF__FFFF | 8th transfer of the store data into the second dram address |
| FFFF__FFFF__FF7F__FFFF | 9th transfer of the store data into the second dram address |
| FFFF__FFFF__FFBF__FFFF | 10th transfer of the store data into the second dram address |
| FFFF__FFFF__FFDF__FFFF | 11th transfer of the store data into the second dram address |
| FFFF__FFFF__FFEF__FFFF | 12th transfer of the store data into the second dram address |
| FFFF__FFFF__FFF7__FFFF | 13th transfer of the store data into the second dram address |
| FFFF__FFFF__FFFB__FFFF | 14th transfer of the store data into the second dram address |
| FFFE__FFFF__FFFD__FFFF | 15th transfer of the store data into the second dram address |
| FFFF__FFFF__FFFE__FFFF | 16th transfer of the store data into the second dram address |
| FFFF__FFFF__FFFF__7FFF | 17th transfer of the store data into the second dram address |
| FFFF__FFFF__FFFF__BFFF | 18th transfer of the store data into the second dram address |
| FFFF__FFFF__FFFF__DFFF | 19th transfer of the store data into the second dram address |
| FFFF__FFFF__FFFF__EFFF | 20th transfer of the store data into the second dram address |
| FFFF__FFFF__FFFF__F7FF | 21th transfer of the store data into the second dram address |

TABLE 2.0-continued

Unique Data Patterns for 32 Data transfer to the 2nd Dram Address for Store Command

| Store Data Pattern to the next consecutive Dram address | Description of Memory Controller Data Transfer Cycle |
|---|---|
| FFFF_FFFF_FFFF_FBFF | 22th transfer of the store data into the second dram address |
| FFFF_FFFF_FFFF_FDFF | 23th transfer of the store data into the second dram address |
| FFFF_FFFF_FFFF_FEFF | 24th transfer of the store data into the second dram address |
| FFFF_FFFF_FFFF_FF7F | 25th transfer of the store data into the second dram address |
| FFFF_FFFF_FFFF_FFBF | 26th transfer of the store data into the second dram address |
| FFFF_FFFF_FFFF_FFDF | 27th transfer of the store data into the second dram address |
| FFFF_FFFF_FFFF_FFEF | 28th transfer of the store data into the second dram address |
| FFFF_FFFF_FFFF_FFF7 | 29th transfer of the store data into the second dram address |
| FFFF_FFFF_FFFF_FFFB | 30th transfer of the store data into the second dram address |
| FFFF_FFFF_FFFF_FFFD | 31th transfer of the store data into the second dram address |
| FFFF_FFFF_FFFF_FFFE | 32th transfer of the store data into the second dram address |

TABLE 3a and 3b

Unique Results For Data Capture Window Early For the Store Command

| Actual Data from 1st Dram Address (in Hex format) | Expected Data Pattern from Data Generator for the 1st Dram Address (in Hex Format) | Error Counters Result (in Hex format) |
|---|---|---|
| FFFF_FFFF_FFFF_FFFF | 7FFF_FFFF_FFFF_FFFF | 1000_0000_0000_0000_0000_0000_0000_0000_0000_0000_0000_0000_0000_0000_0000_0000 |
| FFFF_FFFF_FFFF_FFFF | BFFF_FFFF_FFFF_FFFF | 1100_0000_0000_0000_0000_0000_0000_0000_0000_0000_0000_0000_0000_0000_0000_0000 |
| FFFF_FFFF_FFFF_FFFF | DFFF_FFFF_FFFF_FFFF | 1110_0000_0000_0000_0000_0000_0000_0000_0000_0000_0000_0000_0000_0000_0000_0000 |
| 7FFF_FFFF_FFFF_FFFF | EFFF_FFFF_FFFF_FFFF | 2111_0000_0000_0000_0000_0000_0000_0000_0000_0000_0000_0000_0000_0000_0000_0000 |
| BFFF_FFFF_FFFF_FFFF | F7FF_FFFF_FFFF_FFFF | 2211_1000_0000_0000_0000_0000_0000_0000_0000_0000_0000_0000_0000_0000_0000_0000 |
| DFFF_FFFF_FFFF_FFFF | FBFF_FFFF_FFFF_FFFF | 2221_1100_0000_0000_0000_0000_0000_0000_0000_0000_0000_0000_0000_0000_0000_0000 |
| EFFF_FFFF_FFFF_FFFF | FDFF_FFFF_FFFF_FFFF | 2222_1110_0000_0000_0000_0000_0000_0000_0000_0000_0000_0000_0000_0000_0000_0000 |
| F7FF_FFFF_FFFF_FFFF | FEFF_FFFF_FFFF_FFFF | 2222_2111_0000_0000_0000_0000_0000_0000_0000_0000_0000_0000_0000_0000_0000_0000 |
| FBFF_FFFF_FFFF_FFFF | FF7F_FFFF_FFFF_FFFF | 2222_2211_1000_0000_0000_0000_0000_0000_0000_0000_0000_0000_0000_0000_0000_0000 |
| FDFF_FFFF_FFFF_FFFF | FFBF_FFFF_FFFF_FFFF | 2222_2221_1100_0000_0000_0000_0000_0000_0000_0000_0000_0000_0000_0000_0000_0000 |
| FEFF_FFFF_FFFF_FFFF | FFDF_FFFF_FFFF_FFFF | 2222_2222_1110_0000_0000_0000_0000_0000_0000_0000_0000_0000_0000_0000_0000_0000 |
| FF7F_FFFF_FFFF_FFFF | FFEF_FFFF_FFFF_FFFF | 2222_2222_2111_0000_0000_0000_0000_0000_0000_0000_0000_0000_0000_0000_0000_0000 |
| FFBF_FFFF_FFFF_FFFF | FFF7_FFFF_FFFF_FFFF | 2222_2222_2211_1000_0000_0000_0000_0000_0000_0000_0000_0000_0000_0000_0000_0000 |
| FFDF_FFFF_FFFF_FFFF | FFFB_FFFF_FFFF_FFFF | 2222_2222_2221_1100_0000_0000_0000_0000_0000_0000_0000_0000_0000_0000_0000_0000 |
| FFEF_FFFF_FFFF_FFFF | FFFD_FFFF_FFFF_FFFF | 2222_2222_2222_1110_0000_0000_0000_0000_0000_0000_0000_0000_0000_0000_0000_0000 |
| FFF7_FFFF_FFFF_FFFF | FFFE_FFFF_FFFF_FFFF | 2222_2222_2222_2111_0000_0000_0000_0000_0000_0000_0000_0000_0000_0000_0000_0000 |
| FFFB_FFFF_FFFF_FFFF | FFFF_7FFF_FFFF_FFFF | 2222_2222_2222_2211_1000_0000_0000_0000_0000_0000_0000_0000_0000_0000_0000_0000 |
| FFFD_FFFF_FFFF_FFFF | FFFF_BFFF_FFFF_FFFF | 2222_2222_2222_2221_1100_0000_0000_0000_0000_0000_0000_0000_0000_0000_0000_0000 |
| FFFE_FFFF_FFFF_FFFF | FFFF_DFFF_FFFF_FFFF | 2222_2222_2222_2222_1110_0000_0000_0000_0000_0000_0000_0000_0000_0000_0000_0000 |
| FFFF_7FFF_FFFF_FFFF | FFFF_EFFF_FFFF_FFFF | 2222_2222_2222_2222_2111_0000_0000_0000_0000_0000_0000_0000_0000_0000_0000_0000 |
| FFFF_BFFF_FFFF_FFFF | FFFF_F7FF_FFFF_FFFF | 2222_2222_2222_2222_2211_1000_0000_0000_0000_0000_0000_0000_0000_0000_0000_0000 |
| FFFF_DFFF_FFFF_FFFF | FFFF_FBFF_FFFF_FFFF | 2222_2222_2222_2222_2221_1100_0000_0000_0000_0000_0000_0000_0000_0000_0000_0000 |
| FFFF_EFFF_FFFF_FFFF | FFFF_FDFF_FFFF_FFFF | 2222_2222_2222_2222_2222_2111_0000_0000_0000_0000_0000_0000_0000_0000_0000_0000 |
| FFFF_F7FF_FFFF_FFFF | FFFF_FEFF_FFFF_FFFF | 2222_2222_2222_2222_2222_2211_1000_0000_0000_0000_0000_0000_0000_0000_0000_0000 |
| FFFF_FBFF_FFFF_FFFF | FFFF_FF7F_FFFF_FFFF | 2222_2222_2222_2222_2222_2221_1100_0000_0000_0000_0000_0000_0000_0000_0000_0000 |
| FFFF_FDFF_FFFF_FFFF | FFFF_FFBF_FFFF_FFFF | 2222_2222_2222_2222_2222_2222_1110_0000_0000_0000_0000_0000_0000_0000_0000_0000 |

TABLE 3a and 3b-continued

Unique Results For Data Capture Window Early For the Store Command

| | | |
|---|---|---|
| FFFF_FFFF FFFF_FEFF_ FFFF_FFFF | FFFF_FFFF FFFF_FFDF_ FFFF_FFFF | 2222_2222_2222_2222_2222_2222_2111_0000_0000_0000_0000_0000_0000_0000_0000 |
| FFFF_FF7F_ FFFF_FFFF | FFFF_FEEF_ FFFF_FFFF | 2222_2222_2222_2222_2222_2222_2211_1000_0000_0000_0000_0000_0000_0000_0000 |
| FFFF_FFBF_ FFFF_FFFF | FFFF_FFF7_ FFFF_FFFF | 2222_2222_2222_2222_2222_2222_2221_1100_0000_0000_0000_0000_0000_0000_0000 |
| FFFF_FFDF_ FFFF_FFFF | FFFF_FFFB_ FFFF_FFFF | 2222_2222_2222_2222_2222_2222_2222_1110_0000_0000_0000_0000_0000_0000_0000 |
| FFFE_FEEF_ FFFF_FFFF | FFFF_FFFD_ FFFF_FFFF | 2222_2222_2222_2222_2222_2222_2222_2110_0000_0000_0000_0000_0000_0000_0000 |
| FFFF_FFF7_ FFFF_FFFF | FFFF_FFFE_ FFFF_FFFF | 2222_2222_2222_2222_2222_2222_2222_2111_0000_0000_0000_0000_0000_0000_0000 |

| Actual Data Pattern from 2nd Dram Address (in Hex Format) | Expected Data Pattern from the Data Generator for the 2nd Dram Address (in Hex Format) | Error Counters Result (in Hex Format) |
|---|---|---|
| FFFF_FFFF_ FFFF_FFFF | FFFF_FFFF_ 7FFF_FFFF | 2222_2222_2222_2222_2222_2222_2111_1000_0000_0000_0000_0000_0000_0000_0000 |
| FFFF_FFFF_ FFFF_FFFF | FFFF_FFFF_ BFFF_FFFF | 2222_2222_2222_2222_2222_2222_2111_1100_0000_0000_0000_0000_0000_0000_0000 |
| FFFF_FFFF_ FFFF_FFFF | FFFF_FFFF_ DFFF_FFFF | 2222_2222_2222_2222_2222_2222_2111_1110_0000_0000_0000_0000_0000_0000_0000 |
| FFFF_FFFF_ 7FFF_FFFF | FFFF_FFFF_ EFFF_FFFF | 2222_2222_2222_2222_2222_2222_2111_2111_0000_0000_0000_0000_0000_0000_0000 |
| FFFF_FFFF_ BFFF_FFFF | FFFF_FFFF_ F7FF_FFFF | 2222_2222_2222_2222_2222_2222_2111_2211_1000_0000_0000_0000_0000_0000_0000 |
| FFFF_FFFF_ DFFF_FFFF | FFFF_FFFF_ FBFF_FFFF | 2222_2222_2222_2222_2222_2222_2111_2221_1100_0000_0000_0000_0000_0000_0000 |
| FFFF_FFFF_ EFFF_FFFF | FFFF_FFFF_ FDFF_FFFF | 2222_2222_2222_2222_2222_2222_2111_2222_1110_0000_0000_0000_0000_0000_0000 |
| FFFF_FFFF_ F7FF_FFFF | FFFF_FFFF_ FEFF_FFFF | 2222_2222_2222_2222_2222_2222_2111_2222_2111_0000_0000_0000_0000_0000_0000 |
| FFFF_FFFF_ FBFF_FFFF | FFFF_FFFF_ FF7F_FFFF | 2222_2222_2222_2222_2222_2222_2111_2222_2211_1000_0000_0000_0000_0000_0000 |
| FFFF_FFFF_ FDFF_FFFF | FFFF_FFFF_ FFBF_FFFF | 2222_2222_2222_2222_2222_2222_2111_2222_2221_1100_0000_0000_0000_0000_0000 |
| FFFF_FFFF_ FEFF_FFFF | FFFF_FFFF_ FFDF_FFFF | 2222_2222_2222_2222_2222_2222_2111_2222_2222_1110_0000_0000_0000_0000_0000 |
| FFFF_FFFF_ FF7F_FFFF | FFFF_FFFF_ FFEF_FFFF | 2222_2222_2222_2222_2222_2222_2111_2222_2222_2111_0000_0000_0000_0000_0000 |
| FFFF_FFFF_ FFBF_FFFF | FFFF_FFFF_ FFF7_FFFF | 2222_2222_2222_2222_2222_2222_2111_2222_2222_2211_1000_0000_0000_0000_0000 |
| FFFF_FFFF_ FFDF_FFFF | FFFF_FFFF_ FFFB_FFFF | 2222_2222_2222_2222_2222_2222_2111_2222_2222_2221_1100_0000_0000_0000_0000 |
| FFFF_FFFF_ FFEF_FFFF | FFFF_FFFF_ FFFD_FFFF | 2222_2222_2222_2222_2222_2222_2111_2222_2222_2222_1110_0000_0000_0000_0000 |
| FFFF_FFFF_ FFF7_FFFF | FFFF_FFFF_ FFFE_FFFF | 2222_2222_2222_2222_2222_2222_2111_2222_2222_2222_2111_0000_0000_0000_0000 |
| FFFF_FFFF_ FFFB_FFFF | FFFF_FFFF_ FFFF_7FFF | 2222_2222_2222_2222_2222_2222_2111_2222_2222_2222_2211_1000_0000_0000_0000 |
| FFFF_FFFF_ FFFD_FFFF | FFFF_FFFF_ FFFF_BFFF | 2222_2222_2222_2222_2222_2222_2111_2222_2222_2222_2221_1100_0000_0000_0000 |
| FFFF_FFFF_ FFFE_FFFF | FFFF_FFFF_ FFFF_DFFF | 2222_2222_2222_2222_2222_2222_2111_2222_2222_2222_2222_1110_0000_0000_0000 |
| FFFF_FFFF_ FFFF_7FFF | FFFF_FFFF_ FFFF_EFFF | 2222_2222_2222_2222_2222_2222_2111_2222_2222_2222_2222_2111_0000_0000_0000 |
| FFFF_FFFF_ FFFF_BFFF | FFFF_FFFF_ FFFF_F7FF | 2222_2222_2222_2222_2222_2222_2111_2222_2222_2222_2222_2211_1000_0000_0000 |
| FFFF_FFFF_ FFFF_DFFF | FFFF_FFFF_ FFFF_FBFF | 2222_2222_2222_2222_2222_2222_2111_2222_2222_2222_2222_2221_1100_0000_0000 |
| FFFF_FFFF_ FFFF_EFFF | FFFF_FFFF_ FFFF_FDFF | 2222_2222_2222_2222_2222_2222_2111_2222_2222_2222_2222_2222_1110_0000_0000 |
| FFFF_FFFF_ FFFF_F7FF | FFFF_FFFF_ FFFF_FEFF | 2222_2222_2222_2222_2222_2222_2111_2222_2222_2222_2222_2222_2111_0000_0000 |
| FFFF_FFFF_ FFFF_FBFF | FFFF_FFFF_ FFFF_FF7F | 2222_2222_2222_2222_2222_2222_2111_2222_2222_2222_2222_2222_2211_1000_0000 |
| FFFF_FFFF_ FFFF_FDFF | FFFF_FFFF_ FFFF_FFBF | 2222_2222_2222_2222_2222_2222_2111_2222_2222_2222_2222_2222_2221_1100_0000 |
| FFFF_FFFF_ FFFF_FEFF | FFFF_FFFF_ FFFF_FFDF | 2222_2222_2222_2222_2222_2222_2111_2222_2222_2222_2222_2222_2222_1110_0000 |
| FFFF_FFFF_ FFFF_FF7F | FFFF_FFFF_ FFFF_FFEF | 2222_2222_2222_2222_2222_2222_2111_2222_2222_2222_2222_2222_2222_2111_0000 |
| FFFF_FFFF_ FFFF_FFBF | FFFF_FFFF_ FFFF_FFF7 | 2222_2222_2222_2222_2222_2222_2111_2222_2222_2222_2222_2222_2222_2211_1000 |

TABLE 3a and 3b-continued

Unique Results For Data Capture Window Early For the Store Command

| | | |
|---|---|---|
| FFFF_FFFF_FFFF_FFDF | FFFF_FFFF_FFFF_FFFB | 2222_2222_2222_2222_2222_2222_2222_2111_2222_2222_2222_2222_2222_2222_2221_1100 |
| FFFF_FFFF_FFFF_FFEF | FFFF_FFFF_FFFF_FFFD | 2222_2222_2222_2222_2222_2222_2222_2111_2222_2222_2222_2222_2222_2222_2222_1110 |
| FFFF_FFFF_FFFF_FFF7 | FFFF_FFFF_FFFF_FFFE | 2222_2222_2222_2222_2222_2222_2222_2111_2222_2222_2222_2222_2222_2222_2222_2111 |

Table 3b - Unique Results For Data Capture Window Early For the Store Command

TABLE 4a and 4b

Unique Results For Data Capture Window Late For the Store Command

| Actual Data from 1st Dram Address (in Hex format) | Expected Data Pattern from Data Generator for the 1st Dram Address (in Hex Format) | Error Counters Result (in Hex format) |
|---|---|---|
| EFFF_FFFF_FFFF_FFFF | 7FFF_FFFF_FFFF_FFFF | 1001_0000_0000_0000_0000_0000_0000_0000_0000_0000_0000_0000_0000_0000_0000_0000 |
| F7FF_FFFF_FFFF_FFFF | BFFF_FFFF_FFFF_FFFF | 1101_1000_0000_0000_0000_0000_0000_0000_0000_0000_0000_0000_0000_0000_0000_0000 |
| FBFF_FFFF_FFFF_FFFF | DFFF_FFFF_FFFF_FFFF | 1111_1100_0000_0000_0000_0000_0000_0000_0000_0000_0000_0000_0000_0000_0000_0000 |
| FDFF_FFFF_FFFF_FFFF | EFFF_FFFF_FFFF_FFFF | 1112_1110_0000_0000_0000_0000_0000_0000_0000_0000_0000_0000_0000_0000_0000_0000 |
| FEFF_FFFF_FFFF_FFFF | F7FF_FFFF_FFFF_FFFF | 1112_2111_0000_0000_0000_0000_0000_0000_0000_0000_0000_0000_0000_0000_0000_0000 |
| FF7F_FFFF_FFFF_FFFF | FBFF_FFFF_FFFF_FFFF | 1112_2211_1000_0000_0000_0000_0000_0000_0000_0000_0000_0000_0000_0000_0000_0000 |
| FFBF_FFFF_FFFF_FFFF | FDFF_FFFF_FFFF_FFFF | 1112_2221_1100_0000_0000_0000_0000_0000_0000_0000_0000_0000_0000_0000_0000_0000 |
| FFDF_FFFF_FFFF_FFFF | FEFF_FFFF_FFFF_FFFF | 1112_2222_1110_0000_0000_0000_0000_0000_0000_0000_0000_0000_0000_0000_0000_0000 |
| FFEF_FFFF_FFFF_FFFF | FF7F_FFFF_FFFF_FFFF | 1112_2222_2111_0000_0000_0000_0000_0000_0000_0000_0000_0000_0000_0000_0000_0000 |
| FFF7_FFFF_FFFF_FFFF | FFBF_FFFF_FFFF_FFFF | 1112_2222_2211_1000_0000_0000_0000_0000_0000_0000_0000_0000_0000_0000_0000_0000 |
| FFFB_FFFF_FFFF_FFFF | FFDF_FFFF_FFFF_FFFF | 1112_2222_2221_1100_0000_0000_0000_0000_0000_0000_0000_0000_0000_0000_0000_0000 |
| FFFD_FFFF_FFFF_FFFF | FFEF_FFFF_FFFF_FFFF | 1112_2222_2222_1110_0000_0000_0000_0000_0000_0000_0000_0000_0000_0000_0000_0000 |
| FFFE_FFFF_FFFF_FFFF | FFF7_FFFF_FFFF_FFFF | 1112_2222_2222_2111_0000_0000_0000_0000_0000_0000_0000_0000_0000_0000_0000_0000 |
| FFFF_7FFF_FFFF_FFFF | FFFB_FFFF_FFFF_FFFF | 1112_2222_2222_2211_1000_0000_0000_0000_0000_0000_0000_0000_0000_0000_0000_0000 |
| FFFF_BFFF_FFFF_FFFF | FFFD_FFFF_FFFF_FFFF | 1112_2222_2222_2221_1100_0000_0000_0000_0000_0000_0000_0000_0000_0000_0000_0000 |
| FFFF_DFFF_FFFF_FFFF | FFFE_FFFF_FFFF_FFFF | 1112_2222_2222_2222_1110_0000_0000_0000_0000_0000_0000_0000_0000_0000_0000_0000 |
| FFFF_EFFF_FFFF_FFFF | FFFF_7FFF_FFFF_FFFF | 1112_2222_2222_2222_2111_0000_0000_0000_0000_0000_0000_0000_0000_0000_0000_0000 |
| FFFF_F7FF_FFFF_FFFF | FFFF_BFFF_FFFF_FFFF | 1112_2222_2222_2222_2211_1000_0000_0000_0000_0000_0000_0000_0000_0000_0000_0000 |
| FFFF_FBFF_FFFF_FFFF | FFFF_DFFF_FFFF_FFFF | 1112_2222_2222_2222_2221_1100_0000_0000_0000_0000_0000_0000_0000_0000_0000_0000 |
| FFFF_FDFF_FFFF_FFFF | FFFF_EFFF_FFFF_FFFF | 1112_2222_2222_2222_2222_1110_0000_0000_0000_0000_0000_0000_0000_0000_0000_0000 |
| FFFF_FEFF_FFFF_FFFF | FFFF_F7FF_FFFF_FFFF | 1112_2222_2222_2222_2222_2111_0000_0000_0000_0000_0000_0000_0000_0000_0000_0000 |
| FFFF_FF7F_FFFF_FFFF | FFFF_FBFF_FFFF_FFFF | 1112_2222_2222_2222_2222_2211_1000_0000_0000_0000_0000_0000_0000_0000_0000_0000 |
| FFFF_FFBF_FFFF_FFFF | FFFF_FDFF_FFFF_FFFF | 1112_2222_2222_2222_2222_2221_1100_0000_0000_0000_0000_0000_0000_0000_0000_0000 |
| FFFF_FFDF_FFFF_FFFF | FFFF_FEFF_FFFF_FFFF | 1112_2222_2222_2222_2222_2222_1110_0000_0000_0000_0000_0000_0000_0000_0000_0000 |
| FFFF_FFEF_FFFF_FFFF | FFFF_FF7F_FFFF_FFFF | 1112_2222_2222_2222_2222_2222_2111_0000_0000_0000_0000_0000_0000_0000_0000_0000 |
| FFFF_FFF7_FFFF_FFFF | FFFF_FFBF_FFFF_FFFF | 1112_2222_2222_2222_2222_2222_2211_1000_0000_0000_0000_0000_0000_0000_0000_0000 |
| FFFF_FFFB_FFFF_FFFF | FFFF_FFDF_FFFF_FFFF | 1112_2222_2222_2222_2222_2222_2221_1100_0000_0000_0000_0000_0000_0000_0000_0000 |
| FFFF_FFFD_FFFF_FFFF | FFFF_FFEF_FFFF_FFFF | 1112_2222_2222_2222_2222_2222_2222_1110_0000_0000_0000_0000_0000_0000_0000_0000 |
| FFFF_FFFE_FFFF_FFFF | FFFF_FFF7_FFFF_FFFF | 1112_2222_2222_2222_2222_2222_2222_2111_0000_0000_0000_0000_0000_0000_0000_0000 |

TABLE 4a and 4b-continued

Unique Results For Data Capture Window Late For the Store Command

| | | |
|---|---|---|
| FFFF_FFFF_FFFF_FFFF | FFFF_FFFB_FFFF_FFFF | 1112_2222_2222_2222_2222_2222_2222_2211_0000_0000_0000_0000_0000_0000_0000_0000 |
| FFFF_FFFF_FFFF_FFFF | FFFF_FFFD_FFFF_FFFF | 1112_2222_2222_2222_2222_2222_2222_2221_0000_0000_0000_0000_0000_0000_0000_0000 |
| FFFF_FFFF_FFFF_FFFF | FFFF_FFFE_FFFF_FFFF | 1112_2222_2222_2222_2222_2222_2222_2222_0000_0000_0000_0000_0000_0000_0000_0000 |

| Actual Data Pattern from 2nd Dram Address (in Hex) | Expected Data Pattern from the Data Generator for the 2nd Dram Address (in Hex Format) | Error Counters Result (in Hex) |
|---|---|---|
| FFFF_EFFF_FFFF_FFFF | FFFF_FFFF_7FFF_FFFF | 1112_2222_2222_2222_2222_2222_2222_2222_1001_0000_0000_0000_0000_0000_0000 |
| FFFF_FFFF_FFFF_FFFF | FFFF_FFFF_BFFF_FFFF | 1112_2222_2222_2222_2222_2222_2222_2222_1101_1000_0000_0000_0000_0000_0000 |
| FFFF_F7FF_FFFF_FFFF | FFFF_FFFF_DFFF_FFFF | 1112_2222_2222_2222_2222_2222_2222_2222_1111_1100_0000_0000_0000_0000_0000 |
| FFFF_FFFF_FFFF_FFFF | FFFF_FFFF_EFFF_FFFF | 1112_2222_2222_2222_2222_2222_2222_2222_1112_1110_0000_0000_0000_0000_0000 |
| FFFF_FBFF_FFFF_FFFF | FFFF_FFFF_F7FF_FFFF | 1112_2222_2222_2222_2222_2222_2222_2222_1112_2111_0000_0000_0000_0000_0000 |
| FFFF_FFFF_FFFF_FFFF | FFFF_FFFF_FBFF_FFFF | 1112_2222_2222_2222_2222_2222_2222_2222_1112_2211_1000_0000_0000_0000_0000 |
| FFFF_FDFF_FFFF_FFFF | FFFF_FFFF_FDFF_FFFF | 1112_2222_2222_2222_2222_2222_2222_2222_1112_2221_1100_0000_0000_0000_0000 |
| FFFF_FFFF_FFFF_FFFF | FFFF_FFFF_FEFF_FFFF | 1112_2222_2222_2222_2222_2222_2222_2222_1112_2222_1110_0000_0000_0000_0000 |
| FFFF_FEFF_FFFF_FFFF | FFFF_FFFF_FF7F_FFFF | 1112_2222_2222_2222_2222_2222_2222_2222_1112_2222_2111_0000_0000_0000_0000 |
| FFFF_FFFF_FFFF_FFFF | FFFF_FFFF_FFBF_FFFF | 1112_2222_2222_2222_2222_2222_2222_2222_1112_2222_2211_1000_0000_0000_0000 |
| FFFF_FF7F_FFFF_FFFF | FFFF_FFFF_FFDF_FFFF | 1112_2222_2222_2222_2222_2222_2222_2222_1112_2222_2221_1100_0000_0000_0000 |
| FFFF_FFFF_FFFF_FFFF | FFFF_FFFF_FFEF_FFFF | 1112_2222_2222_2222_2222_2222_2222_2222_1112_2222_2222_1110_0000_0000_0000 |
| FFFF_FFBF_FFFF_FFFF | FFFF_FFFF_FFF7_FFFF | 1112_2222_2222_2222_2222_2222_2222_2222_1112_2222_2222_2111_0000_0000_0000 |
| FFFF_FFFF_FFFF_FFFF | FFFF_FFFF_FFFB_FFFF | 1112_2222_2222_2222_2222_2222_2222_2222_1112_2222_2222_2211_1000_0000_0000 |
| FFFF_FFDF_FFFF_FFFF | FFFF_FFFF_FFFD_FFFF | 1112_2222_2222_2222_2222_2222_2222_2222_1112_2222_2222_2221_1100_0000_0000 |
| FFFF_FFFF_FFFF_FFFF | FFFF_FFFF_FFFT_FFFF | 1112_2222_2222_2222_2222_2222_2222_2222_1112_2222_2222_2222_1110_0000_0000 |
| FFFF_FFFF_FFFF_FFFF | FFFF_FFFF_FFTF_7FFF | 1112_2222_2222_2222_2222_2222_2222_2222_1112_2222_2222_2222_2111_0000_0000 |
| FFFF_FFFF_FFFF_FFFF | FFFF_FFFF_FFFF_BFFF | 1112_2222_2222_2222_2222_2222_2222_2222_1112_2222_2222_2222_2211_1000_0000 |
| FFFF_FFF7_FFFF_FFFF | FFFF_FFFF_FFFF_DFFF | 1112_2222_2222_2222_2222_2222_2222_2222_1112_2222_2222_2222_2221_1100_0000 |
| FFFF_FFFF_FFFF_FFFF | FFFF_FFFF_FFFF_EFFF | 1112_2222_2222_2222_2222_2222_2222_2222_1112_2222_2222_2222_2222_1110_0000 |
| FFFF_FFFB_FFFF_FFFF | FFFF_FFFF_FFFF_F7FF | 1112_2222_2222_2222_2222_2222_2222_2222_1112_2222_2222_2222_2222_2111_0000 |
| FFFF_FFFF_FFFF_FFFF | FFFF_FFFF_FFFF_FBFF | 1112_2222_2222_2222_2222_2222_2222_2222_1112_2222_2222_2222_2222_2211_1000 |
| FFFF_FFFD_FFFF_FFFF | FFFF_FFFF_FFFF_FDFF | 1112_2222_2222_2222_2222_2222_2222_2222_1112_2222_2222_2222_2222_2221_1100 |
| FFFF_FFFF_FFFF_FFFF | FFFF_FFFF_FFFF_FEFF | 1112_2222_2222_2222_2222_2222_2222_2222_1112_2222_2222_2222_2222_2222_1110_0000 |
| FFFF_FFFF_FFFF_FFFF | FFFF_FFFF_FFFF_FF7F | 1112_2222_2222_2222_2222_2222_2222_2222_1112_2222_2222_2222_2222_2222_2111_0000 |
| FFFF_FFFF_FFFF_FFFF | FFFF_FFFF_FFFF_FFBF | 1112_2222_2222_2222_2222_2222_2222_2222_1112_2222_2222_2222_2222_2222_2211_1000 |
| FFFF_FFFF_FFFF_FFFF | FFFF_FFFF_FFFF_FFDF | 1112_2222_2222_2222_2222_2222_2222_2222_1112_2222_2222_2222_2222_2222_2221_1100 |
| FFFF_FFFF_FFFF_FFFF | FFFF_FFFF_FFFF_FFEF | 1112_2222_2222_2222_2222_2222_2222_2222_1112_2222_2222_2222_2222_2222_2222_1110 |
| FFFF_FFFF_FFFF_FFFF | FFFF_FFFF_FFFF_FFF7 | 1112_2222_2222_2222_2222_2222_2222_2222_1112_2222_2222_2222_2222_2222_2222_2111 |
| FFFF_FFFF_FFFF_FFFF | FFFF_FFFF_FFFF_FFFB | 1112_2222_2222_2222_2222_2222_2222_2222_1112_2222_2222_2222_2222_2222_2222_2211 |
| FFFF_FFBF_FFFF_FFFF | FFFF_FFFF_FFFF_FFFD | 1112_2222_2222_2222_2222_2222_2222_2222_1112_2222_2222_2222_2222_2222_2222_2221 |

TABLE 4a and 4b-continued

Unique Results For Data Capture Window Late For the Store Command

| | | |
|---|---|---|
| FFFF_FFFF_ FFFF_FFFF | FFFF_FFFF_ FFFF_FFFF | 1112_2222_2222_2222_2222_2222_2222_2222_1112_2222_2222_2222_2222_2222_2222_2222 |

Table 4b - Unique Results For Data Capture Window Late For the Store Command

TABLE 5a and 5b

Unique Results For Data Capture Window Early For the Fetch Command

| Actual Data from 1st Dram Address (in Hex format) | Expected Data Pattern From Data Generator For the 1st Dram Address (in Hex Format) | Error Counters Result (in Hex format) |
|---|---|---|
| FFFF_EFFF_ EFFF_EFFF | 7FFF_FFFF_ FFFF_FFFF | 1000_0000_0000_0000_0000_0000_0000_0000_0000_0000_0000_0000_0000_0000_0000_0000 |
| FFFF_FFFF_ FFFF_FFFF | BFFF_FFFF_ FFFF_FFFF | 1100_0000_0000_0000_0000_0000_0000_0000_0000_0000_0000_0000_0000_0000_0000_0000 |
| FFFF_FFFF_ FFFF_FFFF | DFFF_FFFF_ FFFF_FFFF | 1110_0000_0000_0000_0000_0000_0000_0000_0000_0000_0000_0000_0000_0000_0000_0000 |
| 7FFF_FFFF_ FFFF_FFFF | EFFF_FFFF_ FFFF_FFFF | 2111_0000_0000_0000_0000_0000_0000_0000_0000_0000_0000_0000_0000_0000_0000_0000 |
| BFFF_FFFF_ FFFF_FFFF | F7FF_FFFF_ FFFF_FFFF | 2211_1000_0000_0000_0000_0000_0000_0000_0000_0000_0000_0000_0000_0000_0000_0000 |
| DFFF_FFFF_ FFFF_FFFF | FBFF_FFFF_ FFFF_FFFF | 2221_1100_0000_0000_0000_0000_0000_0000_0000_0000_0000_0000_0000_0000_0000_0000 |
| EFFF_FFFF_ FFFF_FFFF | FDFF_FFFF_ FFFF_FFFF | 2222_1110_0000_0000_0000_0000_0000_0000_0000_0000_0000_0000_0000_0000_0000_0000 |
| F7FF_FFFF_ FFFF_FFFF | FEFF_FFFF_ FFFF_FFFF | 2222_2111_0000_0000_0000_0000_0000_0000_0000_0000_0000_0000_0000_0000_0000_0000 |
| FBFF_FFFF_ FFFF_FFFF | FF7F_FFFF_ FFFF_FFFF | 2222_2211_1000_0000_0000_0000_0000_0000_0000_0000_0000_0000_0000_0000_0000_0000 |
| FDFF_FFFF_ FFFF_FFFF | FFBF_FFFF_ FFFF_FFFF | 2222_2221_1100_0000_0000_0000_0000_0000_0000_0000_0000_0000_0000_0000_0000_0000 |
| FEFF_FFFF_ FFFF_FFFF | FFDF_FFFF_ FFFF_FFFF | 2222_2222_1110_0000_0000_0000_0000_0000_0000_0000_0000_0000_0000_0000_0000_0000 |
| FF7F_FFFF_ FFFF_FFFF | FFEF_FFFF_ FFFF_FFFF | 2222_2222_2111_0000_0000_0000_0000_0000_0000_0000_0000_0000_0000_0000_0000_0000 |
| FFBF_FFFF_ FFFF_FFFF | FFF7_FFFF_ FFFF_FFFF | 2222_2222_2211_1000_0000_0000_0000_0000_0000_0000_0000_0000_0000_0000_0000_0000 |
| FFDF_FFFF_ FFFF_FFFF | FFFB_FFFF_ FFFF_FFFF | 2222_2222_2221_1100_0000_0000_0000_0000_0000_0000_0000_0000_0000_0000_0000_0000 |
| FFEF_FFFF_ FFFF_FFFF | FFFD_FFFF_ FFFF_FFFF | 2222_2222_2222_1110_0000_0000_0000_0000_0000_0000_0000_0000_0000_0000_0000_0000 |
| FFF7_FFFF_ FFFF_FFFF | FFFE_FFFF_ FFFF_FFFF | 2222_2222_2222_2111_0000_0000_0000_0000_0000_0000_0000_0000_0000_0000_0000_0000 |
| FFFB_FFFF_ FFFF_FFFF | FFFF_7FFF_ FFFF_FFFF | 2222_2222_2222_2211_1000_0000_0000_0000_0000_0000_0000_0000_0000_0000_0000_0000 |
| FFFD_FFFF_ FFFF_FFFF | FFFF_BFFF_ FFFF_FFFF | 2222_2222_2222_2221_1100_0000_0000_0000_0000_0000_0000_0000_0000_0000_0000_0000 |
| FFFE_FFFF_ FFFF_FFFF | FFFF_DFFF_ FFFF_FFFF | 2222_2222_2222_2222_1110_0000_0000_0000_0000_0000_0000_0000_0000_0000_0000_0000 |
| FFFF_7FFF_ FFFF_FFFF | FFFF_EFFF_ FFFF_FFFF | 2222_2222_2222_2222_2111_0000_0000_0000_0000_0000_0000_0000_0000_0000_0000_0000 |
| FFFF_BFFF_ FFFF_FFFF | FFFF_F7FF_ FFFF_FFFF | 2222_2222_2222_2222_2211_1000_0000_0000_0000_0000_0000_0000_0000_0000_0000_0000 |
| FFFF_DFFF_ FFFF_FFFF | FFFF_FBFF_ FFFF_FFFF | 2222_2222_2222_2222_2221_1100_0000_0000_0000_0000_0000_0000_0000_0000_0000_0000 |
| FFFF_EFFF_ FFFF_FFFF | FFFF_FDFF_ FFFF_FFFF | 2222_2222_2222_2222_2222_1110_0000_0000_0000_0000_0000_0000_0000_0000_0000_0000 |
| FFFF_F7FF_ FFFF_FFFF | FFFF_FEFF_ FFFF_FFFF | 2222_2222_2222_2222_2222_2111_0000_0000_0000_0000_0000_0000_0000_0000_0000_0000 |
| FFFF_FBFF_ FFFF_FFFF | FFFF_FF7F_ FFFF_FFFF | 2222_2222_2222_2222_2222_2211_1000_0000_0000_0000_0000_0000_0000_0000_0000_0000 |
| FFFF_FDFF_ FFFF_FFFF | FFFF_FFBF_ FFFF_FFFF | 2222_2222_2222_2222_2222_2221_1100_0000_0000_0000_0000_0000_0000_0000_0000_0000 |
| FFFF_FEFF_ FFFF_FFFF | FFFF_FFDF_ FFFF_FFFF | 2222_2222_2222_2222_2222_2222_1110_0000_0000_0000_0000_0000_0000_0000_0000_0000 |
| FFFF_FF7F_ FFFF_FFFF | FFFF_FFEF_ FFFF_FFFF | 2222_2222_2222_2222_2222_2222_2111_0000_0000_0000_0000_0000_0000_0000_0000_0000 |
| FFFF_FFBF_ FFFF_FFFF | FFFF_FFF7_ FFFF_FFFF | 2222_2222_2222_2222_2222_2222_2211_1000_0000_0000_0000_0000_0000_0000_0000_0000 |
| FFFF_FFDF_ FFFF_FFFF | FFFF_FFFB_ FFFF_FFFF | 2222_2222_2222_2222_2222_2222_2221_1100_0000_0000_0000_0000_0000_0000_0000_0000 |

TABLE 5a and 5b-continued

Unique Results For Data Capture Window Early For the Fetch Command

| | | |
|---|---|---|
| FFFF_FEEF_ FFFF_FFFF | FFFF_FFFD_ FFFF_FFFF | 2222_2222_2222_2222_2222_2222_2222_1110_0000_0000_0000_0000_0000_0000_0000_0000 |
| FFFF_FFF7_ FFFF_FFFF | FFFF_FFFE_ FFFF_FFFF | 2222_2222_2222_2222_2222_2222_2222_2111_0000_0000_0000_0000_0000_0000_0000_0000 |

| Actual Data Pattern from 2nd Dram Address (in Hex) | Expected Data Pattern from the Data Generator for the 2nd Dram Address (in Hex Format) | Error Counters Result (in Hex) |
|---|---|---|
| FFFF_FFFB_ FFFF_FFFF | FFFF_FFFF_ 7FFF_FFFF | 2222_2222_2222_2222_2222_2222_2222_2211_1000_0000_0000_0000_0000_0000_0000_0000 |
| FFFF_FFFD_ FFFF_FFFF | FFFF_FFFF_ BFFF_FFFF | 2222_2222_2222_2222_2222_2222_2222_2221_1100_0000_0000_0000_0000_0000_0000_0000 |
| FFFF_FFFE_ FFFF_FFFF | FFFF_FFFF_ DFFF_FFFF | 2222_2222_2222_2222_2222_2222_2222_2222_1110_0000_0000_0000_0000_0000_0000_0000 |
| FFFF_FFFF_ 7FFF_FFFF | FFFF_FFFF_ EFFF_FFFF | 2222_2222_2222_2222_2222_2222_2222_2222_2111_0000_0000_0000_0000_0000_0000_0000 |
| FFFF_FFFF_ BFFF_FFFF | FFFF_FFFF_ F7FF_FFFF | 2222_2222_2222_2222_2222_2222_2222_2222_2211_1000_0000_0000_0000_0000_0000_0000 |
| FFFF_FFFF_ DFFF_FFFF | FFFF_FFFF_ FBFF_FFFF | 2222_2222_2222_2222_2222_2222_2222_2222_2221_1100_0000_0000_0000_0000_0000_0000 |
| FFFF_FFFF_ EFFF_FFFF | FFFF_FFFF_ FDFF_FFFF | 2222_2222_2222_2222_2222_2222_2222_2222_2222_1110_0000_0000_0000_0000_0000_0000 |
| FFFF_FFFF_ F7FF_FFFF | FFFF_FFFF_ FEFF_FFFF | 2222_2222_2222_2222_2222_2222_2222_2222_2222_2111_0000_0000_0000_0000_0000_0000 |
| FFFF_FFFF_ FBFF_FFFF | FFFF_FFFF_ FF7F_FFFF | 2222_2222_2222_2222_2222_2222_2222_2222_2222_2211_1000_0000_0000_0000_0000_0000 |
| FFFF_FFFF_ FDFF_FFFF | FFFF_FFFF_ FFBF_FFFF | 2222_2222_2222_2222_2222_2222_2222_2222_2222_2221_1100_0000_0000_0000_0000_0000 |
| FFFF_FFFF_ FEFF_FFFF | FFFF_FFFF_ FFDF_FFFF | 2222_2222_2222_2222_2222_2222_2222_2222_2222_2222_1110_0000_0000_0000_0000_0000 |
| FFFF_FFFF_ FF7F_FFFF | FFFF_FFFF_ FFEF_FFFF | 2222_2222_2222_2222_2222_2222_2222_2222_2222_2222_2111_0000_0000_0000_0000_0000 |
| FFFF_FFFF_ FFBF_FFFF | FFFF_FFFF_ FFF7_FFFF | 2222_2222_2222_2222_2222_2222_2222_2222_2222_2222_2211_1000_0000_0000_0000_0000 |
| FFFF_FFFF_ FFDF_FFFF | FFFF_FFFF_ FFFB_FFFF | 2222_2222_2222_2222_2222_2222_2222_2222_2222_2222_2221_1100_0000_0000_0000_0000 |
| FFFF_FFFF_ FFEF_FFFF | FFFF_FFFF_ FFFD_FFFF | 2222_2222_2222_2222_2222_2222_2222_2222_2222_2222_2222_1110_0000_0000_0000_0000 |
| FFFF_FFFF_ FFF7_FFFF | FFFF_FFFF_ FFFE_FFFF | 2222_2222_2222_2222_2222_2222_2222_2222_2222_2222_2222_2111_0000_0000_0000_0000 |
| FFFF_FFFF_ FFFB_FFFF | FFFF_FFFF_ FFFF_7FFF | 2222_2222_2222_2222_2222_2222_2222_2222_2222_2222_2222_2211_1000_0000_0000_0000 |
| FFFF_FFFF_ FFFD_FFFF | FFFF_FFFF_ FFFF_BFFF | 2222_2222_2222_2222_2222_2222_2222_2222_2222_2222_2222_2221_1100_0000_0000_0000 |
| FFFF_FFFF_ FFFE_FFFF | FFFF_FFFF_ FFFF_DFFF | 2222_2222_2222_2222_2222_2222_2222_2222_2222_2222_2222_2222_1110_0000_0000_0000 |
| FFFF_FFFF_ FFFF_7FFF | FFFF_FFFF_ FFFF_EFFF | 2222_2222_2222_2222_2222_2222_2222_2222_2222_2222_2222_2222_2111_0000_0000_0000 |
| FFFF_FFFF_ FFFF_BFFF | FFFF_FFFF_ FFFF_F7FF | 2222_2222_2222_2222_2222_2222_2222_2222_2222_2222_2222_2222_2211_1000_0000_0000 |
| FFFF_FFFF_ FFFF_DFFF | FFFF_FFFF_ FFFF_FBFF | 2222_2222_2222_2222_2222_2222_2222_2222_2222_2222_2222_2222_2221_1100_0000_0000 |
| FFFF_FFFF_ FFFF_EFFF | FFFF_FFFF_ FFFF_FDFF | 2222_2222_2222_2222_2222_2222_2222_2222_2222_2222_2222_2222_2222_1110_0000_0000 |
| FFFF_FFFF_ FFFF_F7FF | FFFF_FFFF_ FFFF_FEFF | 2222_2222_2222_2222_2222_2222_2222_2222_2222_2222_2222_2222_2222_2111_0000_0000 |
| FFFF_FFFF_ FFFF_FBFF | FFFF_FFFF_ FFFF_FF7F | 2222_2222_2222_2222_2222_2222_2222_2222_2222_2222_2222_2222_2222_2211_1000_0000 |
| FFFF_FFFF_ FFFF_FDFF | FFFF_FFFF_ FFFF_FFBF | 2222_2222_2222_2222_2222_2222_2222_2222_2222_2222_2222_2222_2222_2221_1100_0000 |
| FFFF_FFFF_ FFFF_FEFF | FFFF_FFFF_ FFFF_FFDF | 2222_2222_2222_2222_2222_2222_2222_2222_2222_2222_2222_2222_2222_2222_1110_0000 |
| FFFF_FFFF_ FFFF_FF7F | FFFF_FFFF_ FFFF_FFEF | 2222_2222_2222_2222_2222_2222_2222_2222_2222_2222_2222_2222_2222_2222_2111_0000 |
| FFFF_FFFF_ FFFF_FFBF | FFFF_FFFF_ FFFF_FFF7 | 2222_2222_2222_2222_2222_2222_2222_2222_2222_2222_2222_2222_2222_2222_2211_1000 |
| FFFF_FFFF_ FFFF_FFDF | FFFF_FFFF_ FFFF_FFFB | 2222_2222_2222_2222_2222_2222_2222_2222_2222_2222_2222_2222_2222_2222_2221_1100 |
| FFFF_FFFF_ FFFF_FFEF | FFFF_FFFF_ FFFF_FFFD | 2222_2222_2222_2222_2222_2222_2222_2222_2222_2222_2222_2222_2222_2222_2222_1110 |
| FFFF_FFFF_ FFFF_FFF7 | FFFF_FFFF_ FFFF_FFFE | 2222_2222_2222_2222_2222_2222_2222_2222_2222_2222_2222_2222_2222_2222_2222_2111 |

Table 5b - Unique Results For Data Capture Window Early For the Fetch Command

TABLE 6a and 6b

Unique Results For Data Capture Window Late For the Fetch Command

| Actual Data from 1st Dram Address (in Hex format) | Expected Data Pattern from Data Generator for the 1st Dram Address (in Hex Format) | Error Counters Result (in Hex format) |
|---|---|---|
| EFFF_EFFF_EFFF_EFFF | 7FFF_FFFF_FFFF_FFFF | 1001_0000_0000_0000_0000_0000_0000_0000_0000_0000_0000_0000_0000_0000_0000_0000 |
| F7FF_FFFF_FFFF_FFFF | BFFF_FFFF_FFFF_FFFF | 1101_1000_0000_0000_0000_0000_0000_0000_0000_0000_0000_0000_0000_0000_0000_0000 |
| FBFF_FFFF_FFFF_FFFF | DFFF_FFFF_FFFF_FFFF | 1111_1100_0000_0000_0000_0000_0000_0000_0000_0000_0000_0000_0000_0000_0000_0000 |
| FDFF_FFFF_FFFF_FFFF | EFFF_FFFF_FFFF_FFFF | 1112_1110_0000_0000_0000_0000_0000_0000_0000_0000_0000_0000_0000_0000_0000_0000 |
| FEFF_FFFF_FFFF_FFFF | F7FF_FFFF_FFFF_FFFF | 1112_2111_0000_0000_0000_0000_0000_0000_0000_0000_0000_0000_0000_0000_0000_0000 |
| FF7F_FFFF_FFFF_FFFF | FBFF_FFFF_FFFF_FFFF | 1112_2211_1000_0000_0000_0000_0000_0000_0000_0000_0000_0000_0000_0000_0000_0000 |
| FFBF_FFFF_FFFF_FFFF | FDFF_FFFF_FFFF_FFFF | 1112_2221_1100_0000_0000_0000_0000_0000_0000_0000_0000_0000_0000_0000_0000_0000 |
| FFDF_FFFF_FFFF_FFFF | FEFF_FFFF_FFFF_FFFF | 1112_2222_1110_0000_0000_0000_0000_0000_0000_0000_0000_0000_0000_0000_0000_0000 |
| FFEF_FFFF_FFFF_FFFF | FF7F_FFFF_FFFF_FFFF | 1112_2222_2111_0000_0000_0000_0000_0000_0000_0000_0000_0000_0000_0000_0000_0000 |
| FFF7_FFFF_FFFF_FFFF | FFBF_FFFF_FFFF_FFFF | 1112_2222_2211_1000_0000_0000_0000_0000_0000_0000_0000_0000_0000_0000_0000_0000 |
| FFFB_FFFF_FFFF_FFFF | FFDF_FFFF_FFFF_FFFF | 1112_2222_2221_1100_0000_0000_0000_0000_0000_0000_0000_0000_0000_0000_0000_0000 |
| FFFD_FFFF_FFFF_FFFF | FFEF_FFFF_FFFF_FFFF | 1112_2222_2222_1110_0000_0000_0000_0000_0000_0000_0000_0000_0000_0000_0000_0000 |
| FFFE_FFFF_FFFF_FFFF | FFF7_FFFF_FFFF_FFFF | 1112_2222_2222_2111_0000_0000_0000_0000_0000_0000_0000_0000_0000_0000_0000_0000 |
| FFFF_7FFF_FFFF_FFFF | FFFB_FFFF_FFFF_FFFF | 1112_2222_2222_2211_1000_0000_0000_0000_0000_0000_0000_0000_0000_0000_0000_0000 |
| FFFF_BFFF_FFFF_FFFF | FFFD_FFFF_FFFF_FFFF | 1112_2222_2222_2221_1100_0000_0000_0000_0000_0000_0000_0000_0000_0000_0000_0000 |
| FFFF_DFFF_FFFF_FFFF | FFFE_FFFF_FFFF_FFFF | 1112_2222_2222_2222_110_0000_0000_0000_0000_0000_0000_0000_0000_0000_0000_0000 |
| FFFF_EFFF_FFFF_FFFF | FFFF_7FFF_FFFF_FFFF | 1112_2222_2222_2222_2111_0000_0000_0000_0000_0000_0000_0000_0000_0000_0000_0000 |
| FFFF_F7FF_FFFF_FFFF | FFFF_BFFF_FFFF_FFFF | 1112_2222_2222_2222_2211_1000_0000_0000_0000_0000_0000_0000_0000_0000_0000_0000 |
| FFFF_FBFF_FFFF_FFFF | FFFF_DFFF_FFFF_FFFF | 1112_2222_2222_2222_2221_1100_0000_0000_0000_0000_0000_0000_0000_0000_0000_0000 |
| FFFF_FDFF_FFFF_FFFF | FFFF_EFFF_FFFF_FFFF | 1112_2222_2222_2222_2222_1110_0000_0000_0000_0000_0000_0000_0000_0000_0000_0000 |
| FFFF_FEFF_FFFF_FFFF | FFFF_F7FF_FFFF_FFFF | 1112_2222_2222_2222_2222_2111_0000_0000_0000_0000_0000_0000_0000_0000_0000_0000 |
| FFFF_FF7F_FFFF_FFFF | FFFF_FBFF_FFFF_FFFF | 1112_2222_2222_2222_2222_2211_1000_0000_0000_0000_0000_0000_0000_0000_0000_0000 |
| FFFF_FFBF_FFFF_FFFF | FFFF_FDFF_FFFF_FFFF | 1112_2222_2222_2222_2222_2221_1100_0000_0000_0000_0000_0000_0000_0000_0000_0000 |
| FFFF_FFDF_FFFF_FFFF | FFFF_FEFF_FFFF_FFFF | 1112_2222_2222_2222_2222_2222_1110_0000_0000_0000_0000_0000_0000_0000_0000_0000 |
| FFFF_FFEF_FFFF_FFFF | FFFF_FF7F_FFFF_FFFF | 1112_2222_2222_2222_2222_2222_2111_0000_0000_0000_0000_0000_0000_0000_0000_0000 |
| FFFF_FFF7_FFFF_FFFF | FFFF_FFBF_FFFF_FFFF | 1112_2222_2222_2222_2222_2222_2211_1000_0000_0000_0000_0000_0000_0000_0000_0000 |
| FFFF_FFFB_FFFF_FFFF | FFFF_FFDF_FFFF_FFFF | 1112_2222_2222_2222_2222_2222_2221_1100_0000_0000_0000_0000_0000_0000_0000_0000 |
| FFFF_FFFD_FFFF_FFFF | FFFF_FEEF_FFFF_FFFF | 1112_2222_2222_2222_2222_2222_2222_1110_0000_0000_0000_0000_0000_0000_0000_0000 |
| FFFF_FFFE_FFFF_FFFF | FFFF_FFF7_FFFF_FFFF | 1112_2222_2222_2222_2222_2222_2222_2111_0000_0000_0000_0000_0000_0000_0000_0000 |
| FFFF_FFFF_7FFF_FFFF | FFFF_FFFB_FFFF_FFFF | 1112_2222_2222_2222_2222_2222_2222_2211_1000_0000_0000_0000_0000_0000_0000_0000 |
| FFFF_FFFF_BFFF_FFFF | FFFF_FFFD_FFFF_FFFF | 1112_2222_2222_2222_2222_2222_2222_2221_1100_0000_0000_0000_0000_0000_0000_0000 |
| FFFF_FFFF_DFFF_FFFF | FFFF_FFFE_FFFF_FFFF | 1112_2222_2222_2222_2222_2222_2222_2222_1110_0000_0000_0000_0000_0000_0000_0000 |

| Actual Data Pattern from 2nd Dram Address (in Hex) | Expected Data Pattern from the Data Generator for the 2nd Dram Address (in Hex Format) | Error Counters Result (in Hex) |
|---|---|---|
| FFFF_FFFF_EFFF_FFFF | FFFF_FFFF_7FFF_FFFF | 1112_2222_2222_2222_2222_2222_2222_2222_2111_0000_0000_0000_0000_0000_0000 |

TABLE 6a and 6b-continued

Unique Results For Data Capture Window Late For the Fetch Command

| | | |
|---|---|---|
| FFFF_FFFF_F7FF_FFFF | FFFF_FFFF_BFFF_FFFF | 1112_2222_2222_2222_2222_2222_2222_2222_2211_1000_0000_0000_0000_0000_0000 |
| FFFF_FFFF_FBFF_FFFF | FFFF_FFFF_DFFF_FFFF | 1112_2222_2222_2222_2222_2222_2222_2222_2221_1100_0000_0000_0000_0000_0000 |
| FFFF_FFFF_FDFF_FFFF | FFFF_FFFF_EFFF_FFFF | 1112_2222_2222_2222_2222_2222_2222_2222_2222_1110_0000_0000_0000_0000_0000 |
| FFFF_FFFF_FEFF_FFFF | FFFF_FFFF_F7FF_FFFF | 1112_2222_2222_2222_2222_2222_2222_2222_2222_2111_0000_0000_0000_0000_0000 |
| FFFF_FFFF_FF7F_FFFF | FFFF_FFFF_FBFF_FFFF | 1112_2222_2222_2222_2222_2222_2222_2222_2222_2211_1000_0000_0000_0000_0000 |
| FFFF_FFFF_FFBF_FFFF | FFFF_FFFF_FDFF_FFFF | 1112_2222_2222_2222_2222_2222_2222_2222_2222_2221_1100_0000_0000_0000_0000 |
| FFFF_FFFF_FFDF_FFFF | FFFF_FFFF_FEFF_FFFF | 1112_2222_2222_2222_2222_2222_2222_2222_2222_2222_1110_0000_0000_0000_0000 |
| FFFF_FFFF_FFEF_FFFF | FFFF_FFFF_FF7F_FFFF | 1112_2222_2222_2222_2222_2222_2222_2222_2222_2222_2111_0000_0000_0000_0000 |
| FFFF_FFFF_FFF7_FFFF | FFFF_FFFF_FFBF_FFFF | 1112_2222_2222_2222_2222_2222_2222_2222_2222_2222_2211_1000_0000_0000_0000 |
| FFFF_FFFF_FFFB_FFFF | FFFF_FFFF_FFDF_FFFF | 1112_2222_2222_2222_2222_2222_2222_2222_2222_2222_2221_1100_0000_0000_0000 |
| FFFF_FFFF_FFFD_FFFF | FFFF_FFFF_FFEF_FFFF | 1112_2222_2222_2222_2222_2222_2222_2222_2222_2222_2222_1110_0000_0000_0000 |
| FFFF_FFFF_FFFE_FFFF | FFFF_FFFF_FFF7_FFFF | 1112_2222_2222_2222_2222_2222_2222_2222_2222_2222_2222_2111_0000_0000_0000 |
| FFFF_FFFF_FFFF_7FFF | FFFF_FFFF_FFFB_FFFF | 1112_2222_2222_2222_2222_2222_2222_2222_2222_2222_2222_2211_1000_0000_0000 |
| FFFF_FFFF_FFFF_BFFF | FFFF_FFFF_FFFD_FFFF | 1112_2222_2222_2222_2222_2222_2222_2222_2222_2222_2222_2221_1100_0000_0000 |
| FFFF_FFFF_FFFF_DFFF | FFFF_FFFF_FFFE_FFFF | 1112_2222_2222_2222_2222_2222_2222_2222_2222_2222_2222_2222_1110_0000_0000 |
| FFFF_FFFF_FFFF_EFFF | FFFF_FFFF_FFFF_7FFF | 1112_2222_2222_2222_2222_2222_2222_2222_2222_2222_2222_2222_2111_0000_0000 |
| FFFF_FFFF_FFFF_F7FF | FFFF_FFFF_FFFF_BFFF | 1112_2222_2222_2222_2222_2222_2222_2222_2222_2222_2222_2222_2211_1000_0000 |
| FFFF_FFFF_FFFF_FBFF | FFFF_FFFF_FFFF_DFFF | 1112_2222_2222_2222_2222_2222_2222_2222_2222_2222_2222_2222_2221_1100_0000 |
| FFFF_FFFF_FFFF_FDFF | FFFF_FFFF_FFFF_EFFF | 1112_2222_2222_2222_2222_2222_2222_2222_2222_2222_2222_2222_2222_1110_0000 |
| FFFF_FFFF_FFFF_FEFF | FFFF_FFFF_FFFF_F7FF | 1112_2222_2222_2222_2222_2222_2222_2222_2222_2222_2222_2222_2222_2111_0000 |
| FFFF_FFFF_FFFF_FF7F | FFFF_FFFF_FFFF_FBFF | 1112_2222_2222_2222_2222_2222_2222_2222_2222_2222_2222_2222_2222_2211_1000 |
| FFFF_FFFF_FFFF_FFBF | FFFF_FFFF_FFFF_FDFF | 1112_2222_2222_2222_2222_2222_2222_2222_2222_2222_2222_2222_2222_2221_1100 |
| FFFF_FFFF_FFFF_FFDF | FFFF_FFFF_FFFF_FEFF | 1112_2222_2222_2222_2222_2222_2222_2222_2222_2222_2222_2222_2222_2222_1110 |
| FFFF_FFFF_FFFF_FFEF | FFFF_FFFF_FFFF_FF7F | 1112_2222_2222_2222_2222_2222_2222_2222_2222_2222_2222_2222_2222_2222_2111 |
| FFFF_FFFF_FFFF_FFF7 | FFFF_FFFF_FFFF_FFBF | 1112_2222_2222_2222_2222_2222_2222_2222_2222_2222_2222_2222_2222_2222_2211 |
| FFFF_FFFF_FFFF_FFFB | FFFF_FFFF_FFFF_FFDF | 1112_2222_2222_2222_2222_2222_2222_2222_2222_2222_2222_2222_2222_2222_2221 |
| FFFF_FFFF_FFFF_FFFD | FFFF_FFFF_FFFF_FFEF | 1112_2222_2222_2222_2222_2222_2222_2222_2222_2222_2222_2222_2222_2222_1110 |
| FFFF_FFFF_FFFF_FFFE | FFFF_FFFF_FFFF_FFF7 | 1112_2222_2222_2222_2222_2222_2222_2222_2222_2222_2222_2222_2222_2222_2111 |
| FFBF_FFFF_FFFF_FFFB | | 1112_2222_2222_2222_2222_2222_2222_2222_2222_2222_2222_2222_2222_2222_2211 |
| FFDF_FFFF_FFFF_FFFD | | 1112_2222_2222_2222_2222_2222_2222_2222_2222_2222_2222_2222_2222_2222_2221 |
| FFEF_FFFF_FFFF_FFFE | | 1112_2222_2222_2222_2222_2222_2222_2222_2222_2222_2222_2222_2222_2222_2222 |

Table 6b - Unique Results For Data Capture Window Late For the Fetch Command

TABLE 7a and 7b

Unique Results For Data Capture Window Correct For the Store Command

| Actual Data from 1st Dram Address (in Hex format) | Expected Data Pattern from Data Generator for the 1st Dram Address (in Hex Format) | Error Counters Result (in Hex format) |
|---|---|---|
| 7FFF_FFFF_FFFF_FFFF | 7FFF_FFFF_FFFF_FFFF | 0000_0000_0000_0000_0000_0000_0000_0000_0000_0000_0000_0000_0000_0000_0000_0000 |

TABLE 7a and 7b-continued

Unique Results For Data Capture Window Correct For the Store Command

| Actual Data Pattern from 2nd Drain Address (in Hex) | Expected Data Pattern from the Data Generator for the 2nd Dram Address (in Hex Format) | Error Counters Result (in Hex) |
|---|---|---|
| BFFF_FFFF_FFFF_FFFF | FFFF_FFFF_FFFF_FFFF | 0000_0000_0000_0000_0000_0000_0000_0000_0000_0000_0000_0000_0000_0000_0000_0000 |
| DFFF_FFFF_FFFF_FFFF | BFFF_FFFF_FFFF_FFFF | 0000_0000_0000_0000_0000_0000_0000_0000_0000_0000_0000_0000_0000_0000_0000_0000 |
| EFFF_FFFF_FFFF_FFFF | FFFF_FFFF_FFFF_FFFF | 0000_0000_0000_0000_0000_0000_0000_0000_0000_0000_0000_0000_0000_0000_0000_0000 |
| F7FF_FFFF_FFFF_FFFF | DFFF_FFFF_FFFF_FFFF | 0000_0000_0000_0000_0000_0000_0000_0000_0000_0000_0000_0000_0000_0000_0000_0000 |
| FBFF_FFFF_FFFF_FFFF | FFFF_FFFF_FFFF_FFFF | 0000_0000_0000_0000_0000_0000_0000_0000_0000_0000_0000_0000_0000_0000_0000_0000 |
| FDFF_FFFF_FFFF_FFFF | EFFF_FFFF_FFFF_FFFF | 0000_0000_0000_0000_0000_0000_0000_0000_0000_0000_0000_0000_0000_0000_0000_0000 |
| FEFF_FFFF_FFFF_FFFF | FFFF_FFFF_FFFF_FFFF | 0000_0000_0000_0000_0000_0000_0000_0000_0000_0000_0000_0000_0000_0000_0000_0000 |
| FF7F_FFFF_FFFF_FFFF | F7FF_FFFF_FFFF_FFFF | 0000_0000_0000_0000_0000_0000_0000_0000_0000_0000_0000_0000_0000_0000_0000_0000 |
| FFBF_FFFF_FFFF_FFFF | FFFF_FFFF_FFFF_FFFF | 0000_0000_0000_0000_0000_0000_0000_0000_0000_0000_0000_0000_0000_0000_0000_0000 |
| FFDF_FFFF_FFFF_FFFF | FBFF_FFFF_FFFF_FFFF | 0000_0000_0000_0000_0000_0000_0000_0000_0000_0000_0000_0000_0000_0000_0000_0000 |
| FFEF_FFFF_FFFF_FFFF | FFFF_FFFF_FFFF_FFFF | 0000_0000_0000_0000_0000_0000_0000_0000_0000_0000_0000_0000_0000_0000_0000_0000 |
| FFF7_FFFF_FFFF_FFFF | FDFF_FFFF_FFFF_FFFF | 0000_0000_0000_0000_0000_0000_0000_0000_0000_0000_0000_0000_0000_0000_0000_0000 |
| FFFB_FFFF_FFFF_FFFF | FFFF_FFFF_FFFF_FFFF | 0000_0000_0000_0000_0000_0000_0000_0000_0000_0000_0000_0000_0000_0000_0000_0000 |
| FFFD_FFFF_FFFF_FFFF | FEFF_FFFF_FFFF_FFFF | 0000_0000_0000_0000_0000_0000_0000_0000_0000_0000_0000_0000_0000_0000_0000_0000 |
| FFFE_FFFF_FFFF_FFFF | FFFF_FFFF_FFFF_FFFF | 0000_0000_0000_0000_0000_0000_0000_0000_0000_0000_0000_0000_0000_0000_0000_0000 |
| FFFF_7FFF_FFFF_FFFF | FF7F_FFFF_FFFF_FFFF | 0000_0000_0000_0000_0000_0000_0000_0000_0000_0000_0000_0000_0000_0000_0000_0000 |
| FFFF_BFFF_FFFF_FFFF | FFFF_FFFF_FFFF_FFFF | 0000_0000_0000_0000_0000_0000_0000_0000_0000_0000_0000_0000_0000_0000_0000_0000 |
| FFFF_DFFF_FFFF_FFFF | FFBF_FFFF_FFFF_FFFF | 0000_0000_0000_0000_0000_0000_0000_0000_0000_0000_0000_0000_0000_0000_0000_0000 |
| FFFF_EFFF_FFFF_FFFF | FFFF_FFFF_FFFF_FFFF | 0000_0000_0000_0000_0000_0000_0000_0000_0000_0000_0000_0000_0000_0000_0000_0000 |
| FFFF_F7FF_FFFF_FFFF | FFDF_FFFF_FFFF_FFFF | 0000_0000_0000_0000_0000_0000_0000_0000_0000_0000_0000_0000_0000_0000_0000_0000 |
| FFFF_FBFF_FFFF_FFFF | FFFF_FFFF_FFFF_FFFF | 0000_0000_0000_0000_0000_0000_0000_0000_0000_0000_0000_0000_0000_0000_0000_0000 |
| FFFF_FDFF_FFFF_FFFF | FFEF_FFFF_FFFF_FFFF | 0000_0000_0000_0000_0000_0000_0000_0000_0000_0000_0000_0000_0000_0000_0000_0000 |
| FFFF_FEFF_FFFF_FFFF | FFFF_FFFF_FFFF_FFFF | 0000_0000_0000_0000_0000_0000_0000_0000_0000_0000_0000_0000_0000_0000_0000_0000 |
| FFFF_FF7F_FFFF_FFFF | FFF7_FFFF_FFFF_FFFF | 0000_0000_0000_0000_0000_0000_0000_0000_0000_0000_0000_0000_0000_0000_0000_0000 |
| FFFF_FFBF_FFFF_FFFF | FFFF_FFFF_FFFF_FFFF | 0000_0000_0000_0000_0000_0000_0000_0000_0000_0000_0000_0000_0000_0000_0000_0000 |
| FFFF_FFDF_FFFF_FFFF | FFFB_FFFF_FFFF_FFFF | 0000_0000_0000_0000_0000_0000_0000_0000_0000_0000_0000_0000_0000_0000_0000_0000 |
| FFFF_FFEF_FFFF_FFFF | FFFF_FFFF_FFFF_FFFF | 0000_0000_0000_0000_0000_0000_0000_0000_0000_0000_0000_0000_0000_0000_0000_0000 |
| FFFF_FFF7_FFFF_FFFF | FFFD_FFFF_FFFF_FFFF | 0000_0000_0000_0000_0000_0000_0000_0000_0000_0000_0000_0000_0000_0000_0000_0000 |
| FFFF_FFFB_FFFF_FFFF | FFFF_FFFF_FFFF_FFFF | 0000_0000_0000_0000_0000_0000_0000_0000_0000_0000_0000_0000_0000_0000_0000_0000 |
| FFFF_FFFD_FFFF_FFFF | FFFE_FFFF_FFFF_FFFF | 0000_0000_0000_0000_0000_0000_0000_0000_0000_0000_0000_0000_0000_0000_0000_0000 |
| FFFF_FFFE_FFFF_FFFF | FFFF_FFFF_FFFF_FFFF | 0000_0000_0000_0000_0000_0000_0000_0000_0000_0000_0000_0000_0000_0000_0000_0000 |

| Actual Data Pattern from 2nd Drain Address (in Hex) | Expected Data Pattern from the Data Generator for the 2nd Dram Address (in Hex Format) | Error Counters Result (in Hex) |
|---|---|---|
| FFFF_FFFF_7FFF_FFFF | FFFF_FFFF_7FFF_FFFF | 0000_0000_0000_0000_0000_0000_0000_0000_0000_0000_0000_0000_0000_0000_0000_0000 |
| FFFF_FFFF_BFFF_FFFF | FFFF_FFFF_BFFF_FFFF | 0000_0000_0000_0000_0000_0000_0000_0000_0000_0000_0000_0000_0000_0000_0000_0000 |
| FFFF_FFFF_DFFF_FFFF | FFFF_FFFF_DFFF_FFFF | 0000_0000_0000_0000_0000_0000_0000_0000_0000_0000_0000_0000_0000_0000_0000_0000 |
| FFFF_FFFF_EFFF_FFFF | FFFF_FFFF_EFFF_FFFF | 0000_0000_0000_0000_0000_0000_0000_0000_0000_0000_0000_0000_0000_0000_0000_0000 |

TABLE 7a and 7b-continued

Unique Results For Data Capture Window Correct For the Store Command

| | | |
|---|---|---|
| FFFF_FFFF_F7FF_FFFF | FFFF_FFFF_F7FF_FFFF | 0000_0000_0000_0000_0000_0000_0000_0000_0000_0000_0000_0000_0000_0000_0000_0000 |
| FFFF_FFFF_FBFF_FFFF | FFFF_FFFF_FBFF_FFFF | 0000_0000_0000_0000_0000_0000_0000_0000_0000_0000_0000_0000_0000_0000_0000_0000 |
| FFFF_FFFF_FDFF_FFFF | FFFF_FFFF_FDFF_FFFF | 0000_0000_0000_0000_0000_0000_0000_0000_0000_0000_0000_0000_0000_0000_0000_0000 |
| FFFF_FFFF_FEFF_FFFF | FFFF_FFFF_FEFF_FFFF | 0000_0000_0000_0000_0000_0000_0000_0000_0000_0000_0000_0000_0000_0000_0000_0000 |
| FFFF_FFFF_FF7F_FFFF | FFFF_FFFF_FF7F_FFFF | 0000_0000_0000_0000_0000_0000_0000_0000_0000_0000_0000_0000_0000_0000_0000_0000 |
| FFFF_FFFF_FFBF_FFFF | FFFF_FFFF_FFBF_FFFF | 0000_0000_0000_0000_0000_0000_0000_0000_0000_0000_0000_0000_0000_0000_0000_0000 |
| FFFF_FFFF_FFDF_FFFF | FFFF_FFFF_FFDF_FFFF | 0000_0000_0000_0000_0000_0000_0000_0000_0000_0000_0000_0000_0000_0000_0000_0000 |
| FFFF_FFFF_FFEF_FFFF | FFFF_FFFF_FFEF_FFFF | 0000_0000_0000_0000_0000_0000_0000_0000_0000_0000_0000_0000_0000_0000_0000_0000 |
| FFFF_FFFF_FFF7_FFFF | FFFF_FFFF_FFF7_FFFF | 0000_0000_0000_0000_0000_0000_0000_0000_0000_0000_0000_0000_0000_0000_0000_0000 |
| FFFF_FFFF_FFFB_FFFF | FFFF_FFFF_FFFB_FFFF | 0000_0000_0000_0000_0000_0000_0000_0000_0000_0000_0000_0000_0000_0000_0000_0000 |
| FFFF_FFFF_FFFD_FFFF | FFFF_FFFF_FFFD_FFFF | 0000_0000_0000_0000_0000_0000_0000_0000_0000_0000_0000_0000_0000_0000_0000_0000 |
| FFFF_FFFF_FFFE_FFFF | FFFF_FFFF_FFFE_FFFF | 0000_0000_0000_0000_0000_0000_0000_0000_0000_0000_0000_0000_0000_0000_0000_0000 |
| FFFF_FFFF_FFFF_7FFF | FFFF_FFFF_FFFF_7FFF | 0000_0000_0000_0000_0000_0000_0000_0000_0000_0000_0000_0000_0000_0000_0000_0000 |
| FFFF_FFFF_FFFF_BFFF | FFFF_FFFF_FFFF_BFFF | 0000_0000_0000_0000_0000_0000_0000_0000_0000_0000_0000_0000_0000_0000_0000_0000 |
| FFFF_FFFF_FFFF_DFFF | FFFF_FFFF_FFFF_DFFF | 0000_0000_0000_0000_0000_0000_0000_0000_0000_0000_0000_0000_0000_0000_0000_0000 |
| FFFF_FFFF_FFFF_EFFF | FFFF_FFFF_FFFF_EFFF | 0000_0000_0000_0000_0000_0000_0000_0000_0000_0000_0000_0000_0000_0000_0000_0000 |
| FFFF_FFFF_FFFF_F7FF | FFFF_FFFF_FFFF_F7FF | 0000_0000_0000_0000_0000_0000_0000_0000_0000_0000_0000_0000_0000_0000_0000_0000 |
| FFFF_FFFF_FFFF_FBFF | FFFF_FFFF_FFFF_FBFF | 0000_0000_0000_0000_0000_0000_0000_0000_0000_0000_0000_0000_0000_0000_0000_0000 |
| FFFF_FFFF_FFFF_FDFF | FFFF_FFFF_FFFF_FDFF | 0000_0000_0000_0000_0000_0000_0000_0000_0000_0000_0000_0000_0000_0000_0000_0000 |
| FFFF_FFFF_FFFF_FEFF | FFFF_FFFF_FFFF_FEFF | 0000_0000_0000_0000_0000_0000_0000_0000_0000_0000_0000_0000_0000_0000_0000_0000 |
| FFFF_FFFF_FFFF_FF7F | FFFF_FFFF_FFFF_FF7F | 0000_0000_0000_0000_0000_0000_0000_0000_0000_0000_0000_0000_0000_0000_0000_0000 |
| FFFF_FFFF_FFFF_FFBF | FFFF_FFFF_FFFF_FFBF | 0000_0000_0000_0000_0000_0000_0000_0000_0000_0000_0000_0000_0000_0000_0000_0000 |
| FFFF_FFFF_FFFF_FFDF | FFFF_FFFF_FFFF_FFDF | 0000_0000_0000_0000_0000_0000_0000_0000_0000_0000_0000_0000_0000_0000_0000_0000 |
| FFFF_FFFF_FFFF_FFEF | FFFF_FFFF_FFFF_FFEF | 0000_0000_0000_0000_0000_0000_0000_0000_0000_0000_0000_0000_0000_0000_0000_0000 |
| FFFF_FFFF_FFFF_FFF7 | FFFF_FFFF_FFFF_FFF7 | 0000_0000_0000_0000_0000_0000_0000_0000_0000_0000_0000_0000_0000_0000_0000_0000 |
| FFFF_FFFF_FFFF_FFFB | FFFF_FFFF_FFFF_FFFB | 0000_0000_0000_0000_0000_0000_0000_0000_0000_0000_0000_0000_0000_0000_0000_0000 |
| FFFF_FFFF_FFFF_FFFD | FFFF_FFFF_FFFF_FFFD | 0000_0000_0000_0000_0000_0000_0000_0000_0000_0000_0000_0000_0000_0000_0000_0000 |
| FFFF_FFFF_FFFF_FFFE | FFFF_FFFF_FFFF_FFFE | 0000_0000_0000_0000_0000_0000_0000_0000_0000_0000_0000_0000_0000_0000_0000_0000 |

Table 7b - Unique Results For Data Capture Window Correct For the Store Command

TABLE 8a and 8b

Unique Results For Data Capture Window Late For the Store Command
And Data Capture Window Late For Fetch Command

| Actual Data from 1st Dram Address (in Hex format) | Expected Data Pattern from Data Generator for the 1st Dram Address (in Hex Format) | Error Counters Result (in Hex format) |
|---|---|---|
| FDFF_FFFF_FFFF_FFFF | 7FFF_FFFF_FFFF_FFFF | 1000_0010_0000_0000_0000_0000_0000_0000_0000_0000_0000_0000_0000_0000_0000_0000 |
| FEFF_FFFF_FFFF_FFFF | BFFF_FFFF_FFFF_FFFF | 1100_0011_0000_0000_0000_0000_0000_0000_0000_0000_0000_0000_0000_0000_0000_0000 |
| FF7F_FFFF_FFFF_FFFF | DFFF_FFFF_FFFF_FFFF | 1110_0011_1000_0000_0000_0000_0000_0000_0000_0000_0000_0000_0000_0000_0000_0000 |

TABLE 8a and 8b-continued

Unique Results For Data Capture Window Late For the Store Command
And Data Capture Window Late For Fetch Command

| | | |
|---|---|---|
| FFBF_FFFF_FFFF_FFFF | EFFF_FFFF_FFFF_FFFF | 1111_0011_1100_0000_0000_0000_0000_0000_0000_0000_0000_0000_0000_0000_0000_0000 |
| FFDF_FFFF_FFFF_FFFF | F7FF_FFFF_FFFF_FFFF | 1111_1011_1110_0000_0000_0000_0000_0000_0000_0000_0000_0000_0000_0000_0000_0000 |
| FFEF_FFFF_FFFF_FFFF | FBFF_FFFF_FFFF_FFFF | 1111_1111_1111_0000_0000_0000_0000_0000_0000_0000_0000_0000_0000_0000_0000_0000 |
| FFF7_FFFF_FFFF_FFFF | FDFF_FFFF_FFFF_FFFF | 1111_1121_1111_1000_0000_0000_0000_0000_0000_0000_0000_0000_0000_0000_0000_0000 |
| FFFB_FFFF_FFFF_FFFF | FEFF_FFFF_FFFF_FFFF | 1111_1122_1111_1100_0000_0000_0000_0000_0000_0000_0000_0000_0000_0000_0000_0000 |
| FFFD_FFFF_FFFF_FFFF | FF7F_FFFF_FFFF_FFFF | 1111_1122_2111_1110_0000_0000_0000_0000_0000_0000_0000_0000_0000_0000_0000_0000 |
| FFFE_FFFF_FFFF_FFFF | FFBF_FFFF_FFFF_FFFF | 1111_1122_2211_1111_0000_0000_0000_0000_0000_0000_0000_0000_0000_0000_0000_0000 |
| FFFF_7FFF_FFFF_FFFF | FFDF_FFFF_FFFF_FFFF | 1111_1122_2221_1111_1000_0000_0000_0000_0000_0000_0000_0000_0000_0000_0000_0000 |
| FFFF_BFFF_FFFF_FFFF | FFEF_FFFF_FFFF_FFFF | 1111_1122_2222_1111_1100_0000_0000_0000_0000_0000_0000_0000_0000_0000_0000_0000 |
| FFFF_DFFF_FFFF_FFFF | FFF7_FFFF_FFFF_FFFF | 1111_1122_2222_2111_1110_0000_0000_0000_0000_0000_0000_0000_0000_0000_0000_0000 |
| FFFF_EFFF_FFFF_FFFF | FFFB_FFFF_FFFF_FFFF | 1111_1122_2222_2211_1111_0000_0000_0000_0000_0000_0000_0000_0000_0000_0000_0000 |
| FFFF_F7FF_FFFF_FFFF | FFFD_FFFF_FFFF_FFFF | 1111_1122_2222_2221_1111_1000_0000_0000_0000_0000_0000_0000_0000_0000_0000_0000 |
| FFFF_FBFF_FFFF_FFFF | FFFE_FFFF_FFFF_FFFF | 1111_1122_2222_2222_1111_1100_0000_0000_0000_0000_0000_0000_0000_0000_0000_0000 |
| FFFF_FDFF_FFFF_FFFF | FFFF_7FFF_FFFF_FFFF | 1111_1122_2222_2222_2111_1110_0000_0000_0000_0000_0000_0000_0000_0000_0000_0000 |
| FFFF_FEFF_FFFF_FFFF | FFFF_BFFF_FFFF_FFFF | 1111_1122_2222_2222_2211_1111_0000_0000_0000_0000_0000_0000_0000_0000_0000_0000 |
| FFFF_FF7F_FFFF_FFFF | FFFF_DFFF_FFFF_FFFF | 1111_1122_2222_2222_2221_1111_1000_0000_0000_0000_0000_0000_0000_0000_0000_0000 |
| FFFF_FFBF_FFFF_FFFF | FFFF_EFFF_FFFF_FFFF | 1111_1122_2222_2222_2222_1111_1100_0000_0000_0000_0000_0000_0000_0000_0000_0000 |
| FFFF_FFDF_FFFF_FFFF | FFFF_F7FF_FFFF_FFFF | 1111_1122_2222_2222_2222_2111_1110_0000_0000_0000_0000_0000_0000_0000_0000_0000 |
| FFFF_FFEF_FFFF_FFFF | FFFF_FBFF_FFFF_FFFF | 1111_1122_2222_2222_2222_2211_1111_0000_0000_0000_0000_0000_0000_0000_0000_0000 |
| FFFF_FFF7_FFFF_FFFF | FFFF_FDFF_FFFF_FFFF | 1111_1122_2222_2222_2222_2221_1111_1000_0000_0000_0000_0000_0000_0000_0000_0000 |
| FFFF_FFFB_FFFF_FFFF | FFFF_FEFF_FFFF_FFFF | 1111_1122_2222_2222_2222_2222_1111_1100_0000_0000_0000_0000_0000_0000_0000_0000 |
| FFFF_FFFD_FFFF_FFFF | FFFF_FF7F_FFFF_FFFF | 1111_1122_2222_2222_2222_2222_2111_1110_0000_0000_0000_0000_0000_0000_0000_0000 |
| FFFF_FFFF_FFFF_FFFF | FFFF_FFBF_FFFF_FFFF | 1111_1122_2222_2222_2222_2222_2211_1111_0000_0000_0000_0000_0000_0000_0000_0000 |
| FFFF_FFFF_FFFF_FFFF | FFFF_FFDF_FFFF_FFFF | 1111_1122_2222_2222_2222_2222_2221_1111_0000_0000_0000_0000_0000_0000_0000_0000 |
| FFFF_FFFF_FFFF_FFFF | FFFF_FFEF_FFFF_FFFF | 1111_1122_2222_2222_2222_2222_2222_1111_0000_0000_0000_0000_0000_0000_0000_0000 |
| FFFF_FFFF_FFFF_FFFF | FFFF_FFF7_FFFF_FFFF | 1111_1122_2222_2222_2222_2222_2222_2111_0000_0000_0000_0000_0000_0000_0000_0000 |
| FFFF_FFFF_FFFF_FFFF | FFFF_FFFB_FFFF_FFFF | 1111_1122_2222_2222_2222_2222_2222_2211_0001_0000_0000_0000_0000_0000_0000_0000 |
| FFFF_FFFF_F7FF_FFFF | FFFF_FFFD_FFFF_FFFF | 1111_1122_2222_2222_2222_2222_2222_2221_0001_1000_0000_0000_0000_0000_0000_0000 |
| FFFF_FFFF_FBFF_FFFF | FFFF_FFFE_FFFF_FFFF | 1111_1122_2222_2222_2222_2222_2222_2222_0001_1100_0000_0000_0000_0000_0000_0000 |

| Actual Data Pattern from 2nd Dram Address (in Hex) | Expected Data Pattern from the Data Generator for the 2nd Dram Address (in Hex Format) | Error Counters Result (in Hex) |
|---|---|---|
| FFFF_FFFF_FDFF_FFFF | FFFF_FFFF_7FFF_FFFF | 1111_1122_2222_2222_2222_2222_2222_2222_1001_1110_0000_0000_0000_0000_0000_0000 |
| FFFF_FFFF_FEFF_FFFF | FFFF_FFFF_BFFF_FFFF | 1111_1122_2222_2222_2222_2222_2222_2222_1101_1111_0000_0000_0000_0000_0000_0000 |
| FFFF_FFFF_FF7F_FFFF | FFFF_FFFF_DFFF_FFFF | 1111_1122_2222_2222_2222_2222_2222_2222_1111_1111_1000_0000_0000_0000_0000_0000 |
| FFFF_FFFF_FFBF_FFFF | FFFF_FFFF_EFFF_FFFF | 1111_1122_2222_2222_2222_2222_2222_2222_1112_1111_1100_0000_0000_0000_0000_0000 |
| FFFF_FFFF_FFDF_FFFF | FFFF_FFFF_F7FF_FFFF | 1111_1122_2222_2222_2222_2222_2222_2222_1112_1111_1110_0000_0000_0000_0000_0000 |
| FFFF_FFFF_FFEF_FFFF | FFFF_FFFF_FBFF_FFFF | 1111_1122_2222_2222_2222_2222_2222_2222_1112_2211_1111_0000_0000_0000_0000_0000 |

TABLE 8a and 8b-continued

Unique Results For Data Capture Window Late For the Store Command
And Data Capture Window Late For Fetch Command

| | | |
|---|---|---|
| FFFF_FFFF_FFF7_FFFF | FFFF_FFFF_FDFF_FFFF | 1111_1122_2222_2222_2222_2222_2222_2222_1112_2221_1111_1000_0000_0000_0000_0000 |
| FFFF_FFFF_FFFB_FFFF | FFFF_FFFF_FEFF_FFFF | 1111_1122_2222_2222_2222_2222_2222_2222_1112_2222_1111_1100_0000_0000_0000_0000 |
| FFFF_FFFF_FFFD_FFFF | FFFF_FFFF_FF7F_FFFF | 1111_1122_2222_2222_2222_2222_2222_2222_1112_2222_2111_1110_0000_0000_0000_0000 |
| FFFF_FFFF_FFFE_FFFF | FFFF_FFFF_FFBF_FFFF | 1111_1122_2222_2222_2222_2222_2222_2222_1112_2222_2211_1111_0000_0000_0000_0000 |
| FFFF_FFFF_FFFF_7FFF | FFFF_FFFF_FFDF_FFFF | 1111_1122_2222_2222_2222_2222_2222_2222_1112_2222_2221_1111_0000_0000_0000_0000 |
| FFFF_FFFF_FFFF_BFFF | FFFF_FFFF_FFEF_FFFF | 1111_1122_2222_2222_2222_2222_2222_2222_1112_2222_2222_1111_0000_0000_0000_0000 |
| FFFF_FFFF_FFFF_DFFF | FFFF_FFFF_FFF7_FFFF | 1111_1122_2222_2222_2222_2222_2222_2222_1112_2222_2222_2111_1110_0000_0000_0000 |
| FFFF_FFFF_FFFF_EFFF | FFFF_FFFF_FFFB_FFFF | 1111_1122_2222_2222_2222_2222_2222_2222_1112_2222_2222_2211_1111_0000_0000_0000 |
| FFFF_FFFF_FFFF_F7FF | FFFF_FFFF_FFFD_FFFF | 1111_1122_2222_2222_2222_2222_2222_2222_1112_2222_2222_2221_1111_1000_0000_0000 |
| FFFF_FFFF_FFFF_FBFF | FFFF_FFFF_FFFE_FFFF | 1111_1122_2222_2222_2222_2222_2222_2222_1112_2222_2222_2222_1111_1100_0000_0000 |
| FFFF_FFFF_FFFF_FDFF | FFFF_FFFF_FFFF_7FFF | 1111_1122_2222_2222_2222_2222_2222_2222_1112_2222_2222_2222_2111_1110_0000_0000 |
| FFFF_FFFF_FFFF_FEFF | FFFF_FFFF_FFFF_BFFF | 1111_1122_2222_2222_2222_2222_2222_2222_1112_2222_2222_2222_2211_1111_0000_0000 |
| FFFF_FFFF_FFFF_FF7F | FFFF_FFFF_FFFF_DFFF | 1111_1122_2222_2222_2222_2222_2222_2222_1112_2222_2222_2222_2221_1111_1000_0000 |
| FFFF_FFFF_FFFF_FFBF | FFFF_FFFF_FFFF_EFFF | 1111_1122_2222_2222_2222_2222_2222_2222_1112_2222_2222_2222_2222_1111_1100_0000 |
| FFFF_FFFF_FFFF_FFDF | FFFF_FFFF_FFFF_F7FF | 1111_1122_2222_2222_2222_2222_2222_2222_1112_2222_2222_2222_2222_2111_1110_0000 |
| FFFF_FFFF_FFFF_FFEF | FFFF_FFFF_FFFF_FBFF | 1111_1122_2222_2222_2222_2222_2222_2222_1112_2222_2222_2222_2222_2211_1111_0000 |
| FFFF_FFFF_FFFF_FFF7 | FFFF_FFFF_FFFF_FDFF | 1111_1122_2222_2222_2222_2222_2222_2222_1112_2222_2222_2222_2222_2221_1111_1000 |
| FFFF_FFFF_FFFF_FFFB | FFFF_FFFF_FFFF_FEFF | 1111_1122_2222_2222_2222_2222_2222_2222_1112_2222_2222_2222_2222_2222_1111_1100 |
| FFFF_FFFF_FFFF_FFFD | FFFF_FFFF_FFFF_FF7F | 1111_1122_2222_2222_2222_2222_2222_2222_1112_2222_2222_2222_2222_2222_2111_1110 |
| FFFF_FFFF_FFFF_FFFE | FFFF_FFFF_FFFF_FFBF | 1111_1122_2222_2222_2222_2222_2222_2222_1112_2222_2222_2222_2222_2222_2211_1111 |
| FFFF_FFFF_FFFF_FFFF | FFFF_FFFF_FFFF_FFDF | 1111_1122_2222_2222_2222_2222_2222_2222_1112_2222_2222_2222_2222_2222_2221_1111 |
| FFFF_FFFF_FFFF_FFFF | FFFF_FFFF_FFFF_FFEF | 1111_1122_2222_2222_2222_2222_2222_2222_1112_2222_2222_2222_2222_2222_2222_1111 |
| FFFF_FFFF_FFFF_FFFF | FFFF_FFFF_FFFF_FFF7 | 1111_1122_2222_2222_2222_2222_2222_2222_1112_2222_2222_2222_2222_2222_2222_2111 |
| FFFF_FFFF_FFFF_FFFF | FFFF_FFFF_FFFF_FFFB | 1111_1122_2222_2222_2222_2222_2222_2222_1112_2222_2222_2222_2222_2222_2222_2211 |
| FFFF_FFFF_FFFF_FFFF | FFFF_FFFF_FFFF_FFFD | 1111_1122_2222_2222_2222_2222_2222_2222_1112_2222_2222_2222_2222_2222_2222_2221 |
| FFFF_FFFF_FFFF_FFFF | FFFF_FFFF_FFFF_FFFE | 1111_1122_2222_2222_2222_2222_2222_2222_1112_2222_2222_2222_2222_2222_2222_2222 |

Table 8b - Unique Results For Data Capture Window Late For the Store Command And Data Capture Window Late For Fetch Command

What is claimed is:

1. A method to synchronize data capture windows for movement of data bits along parallel data paths, the method comprising:

generating a set of data bit sequences to detect latency differences between a plurality of data paths along which the set of data bit sequences move;

transferring the set of data bit sequences from a sender to a receiver through a first set of data paths in the plurality of data paths using a first transfer pattern;

transferring the set of data bit sequences from the receiver back to the sender through a second set of data paths in the plurality of data paths using a second transfer pattern, wherein the second set of data paths and the second transfer pattern are different from the first set of data paths and the first transfer pattern, respectively;

fetching a set of results of associated with transferring the set of data bit sequences from the receiver back to the sender;

distinguishing a first set of latency characters in the first set of data paths from a second set of latency characters in the second set of data paths based on the set of results that has been fetched;

performing a first adjustment of a data path capture window associated with one of the first set of data paths and the second set of data paths; and performing a second adjustment, in response to the first adjustment, on a data path capture window associated with the remaining data path in the one of the first set of data paths and the second set of data paths.

2. The method of claim 1, further comprising:

using a self test engine in the sender to create the set of data bit sequences; and generating an output indicating the first set of latency characters and the second set of latency characters.

3. The method of claim 2, further comprising:
performing another transfer of the set of data bit sequences from the receiver to the sender on the second set of data paths to adjust the data path capture window associated with the second set of data paths.

4. The method of claim 3, wherein the set of data bit sequences is transferred in spaced transmissions to two locations in the receiver preventing overlap of data bits in the set of data bit sequences from one transmission to the other.

5. The method of claim 4, wherein the results of the another transfer to the receiver are sent back to the sender in a continuous transmission without any delay.

6. The method of claim 5, wherein the receiver is at least one memory module on at least one memory card without error detection capability.

7. The method of claim 6, wherein the sender is a memory controller comprising the self test engine.

8. The method of claim 7, wherein the set of data bit sequences is arranged in a set of pairs with one bit one of a first string of data bit sequences in a pair in the set of pairs is different from each of string of data bit sequences in all other pairs in the set of pairs and a second string of data bit sequences in each pair are the same but differ from any said string of data bit sequences.

9. The method of claim 8, wherein each data bit sequence in the set of data bit sequences is one data word and said one data bit sequences differ from any other data bit sequence by at least one bit.

10. A method to synchronize data capture windows for movement of data bits along parallel data paths, the method comprising:
generating two sets of data bit sequences with a self test apparatus to detect latency differences between a plurality of data paths along which the two sets of data bit sequences move;
transferring the two sets of data bit sequences from a sender to a receiver through a first set of data paths in the plurality of data paths using a set of spaced transfer patterns;
transferring the two sets of data bit sequences from the receiver back to the sender through a second set of data paths in the plurality of data paths using a set of abutting transfer patterns, wherein the second set of data paths is different from the first set of data paths;
fetching a set of results of associated with transferring the two sets of data bit sequences from the receiver back to the sender;
distinguishing a first set of latency characteristics in the first set of data paths from a second set of latency characteristics in the second set of data paths based on the set of results that has been fetched;
using the self test apparatus to indicate the first set of latency characteristics and the second set of latency characteristics;
adjusting a first data path capture window associated with the first set of data paths based on the first set of latency characteristics; and
adjusting, in response to adjusting the first data path capture window, a second data path capture window associated with the second set of data paths.

11. The method of claim 10, wherein the set of data bit sequences is transferred in spaced transmissions to two locations in the receiver preventing overlap of data bits in the set of data bit sequences from one transmission to the other.

12. The method of claim 10, wherein the results of the transferring the two sets of data bit sequences to the receiver are sent back to the sender in a continuous transmission without any delay, enabling a location of errors in one of the receiver and the sender.

13. The method of claim 12, wherein the receiver is at least one memory module on at least one memory card without error detection capability.

14. The method of claim 11, wherein the sender is a memory controller comprising a self test engine.

15. The method of claim 10, wherein alternate strings of data bit sequences are different from all of said data bit sequences and all strings of data bit sequences intermediate from said alternate strings of data bit sequences are all the same but differ from any alternate string of data bit sequences.

16. The method of claim 10, wherein indicating the first set of latency characteristics and the second set of latency characteristics comprises identifying early and late capture windows.

* * * * *